United States Patent
Sakimura et al.

(10) Patent No.: US 7,292,471 B2
(45) Date of Patent: Nov. 6, 2007

(54) SEMICONDUCTOR MEMORY DEVICE HAVING A VOLTAGE-CONTROLLED-OSCILLATOR-BASED READOUT CIRCUIT

(75) Inventors: Noboru Sakimura, Tokyo (JP); Takeshi Honda, Tokyo (JP); Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/384,920

(22) Filed: Mar. 20, 2006

(65) Prior Publication Data

US 2006/0158945 A1    Jul. 20, 2006

Related U.S. Application Data

(60) Division of application No. 10/934,599, filed on Sep. 3, 2004, now Pat. No. 7,133,312, which is a continuation of application No. PCT/JP03/02094, filed on Feb. 26, 2003.

(30) Foreign Application Priority Data

Mar. 4, 2002    (JP) ............... 2002-056810

(51) Int. Cl.
*G11C 11/15* (2006.01)
(52) U.S. Cl. ............ 365/173; 365/171; 365/158; 365/209; 365/236; 365/189.07; 365/189.05
(58) Field of Classification Search ......... 365/189.07, 365/189.05, 210, 209, 236, 173, 171, 158
See application file for complete search history.

(56) References Cited

U.S. PATENT DOCUMENTS

| | | | | |
|---|---|---|---|---|
| 4,596,001 A | * | 6/1986 | Baba | 365/230.03 |
| 4,881,203 A | * | 11/1989 | Watanabe et al. | 365/203 |
| 5,043,945 A | * | 8/1991 | Bader | 365/190 |
| 5,377,149 A | * | 12/1994 | Gaultier | 365/203 |
| 6,205,073 B1 | | 3/2001 | Naji | 365/209 |

FOREIGN PATENT DOCUMENTS

| | | |
|---|---|---|
| JP | 2001-325791 | 11/2001 |
| JP | 2002-32983 | 1/2002 |
| WO | WO 01/24185 A1 | 4/2001 |

* cited by examiner

*Primary Examiner*—Andrew Q. Tran
(74) *Attorney, Agent, or Firm*—Scully, Scott, Murphy & Presser, P.C.

(57) ABSTRACT

By first readout, the current input from a selected cell is converted by a preamplifier and a VCO into pulses of a frequency inversely proportionate to the current value, and the number of the pulses within a preset time interval is counted by a counter 5 so as to be stored in a readout value register. A selected cell is then written to one of two storage states, and second readout is then carried out. The storage state of the selected cell is verified by comparing a count value of the counter for the second readout, a count value for the first readout as stored in a readout value register and a reference value stored in a reference value register to one another. By the use of the VCO, the integrating capacitor for the current or the generation of a reference pulse may be eliminated.

23 Claims, 26 Drawing Sheets

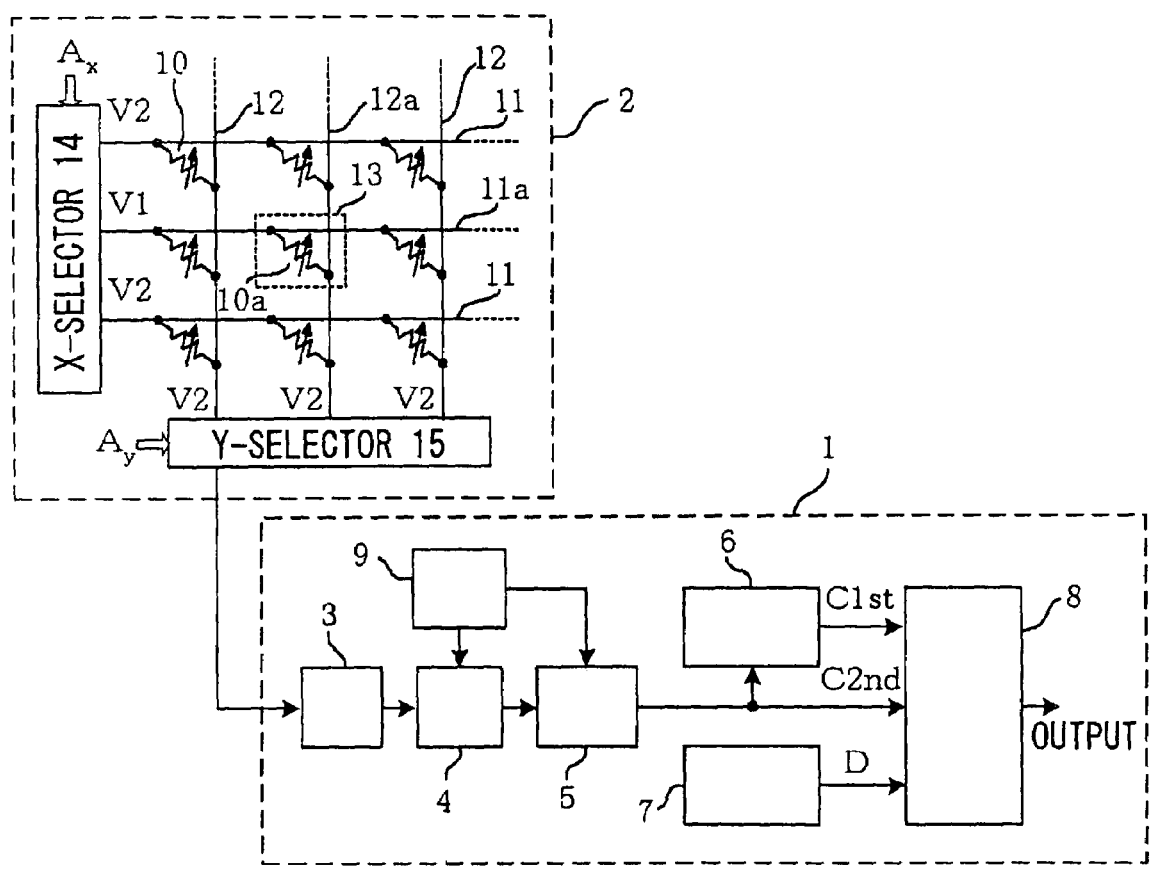

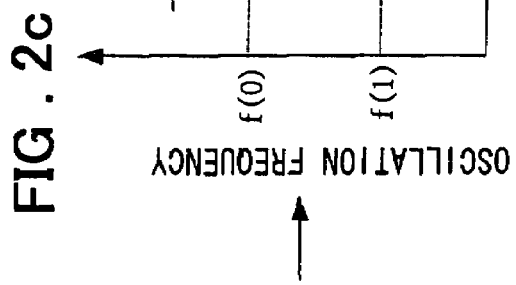
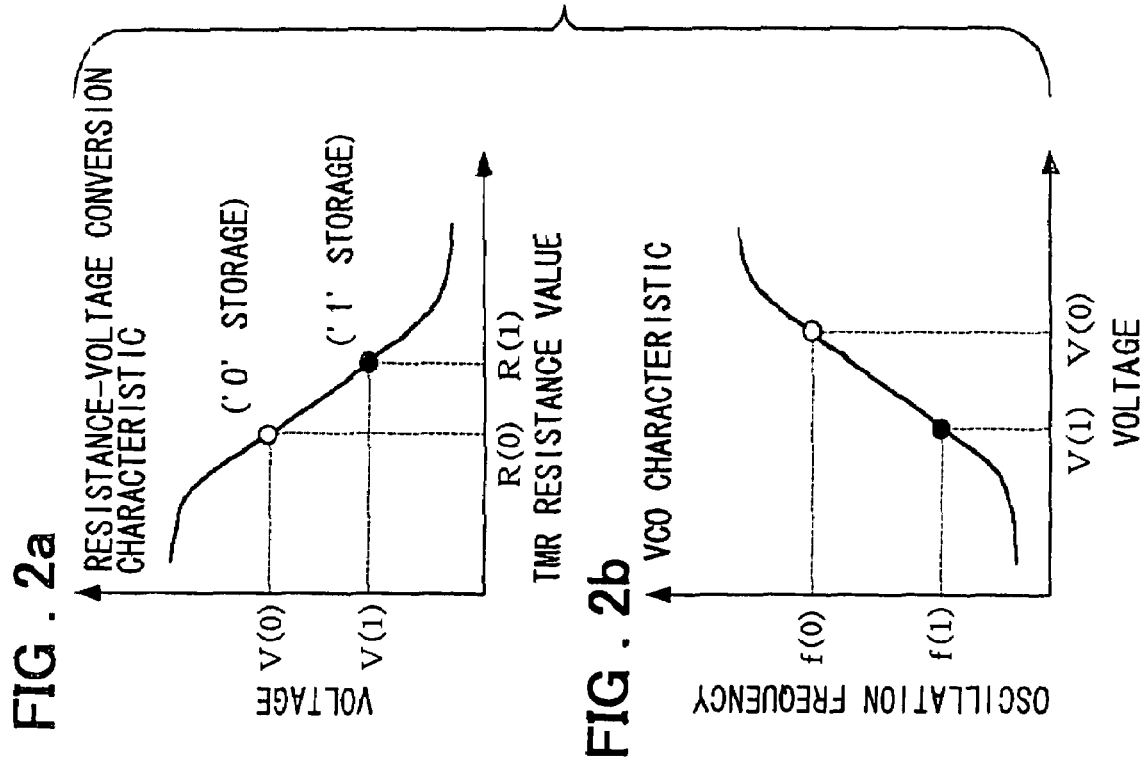

TO MEMORY CELL ARRAY

TO MEMORY CELL ARRAY

US 7,292,471 B2

SEMICONDUCTOR MEMORY DEVICE HAVING A VOLTAGE-CONTROLLED-OSCILLATOR-BASED READOUT CIRCUIT

CROSS-REFERENCE TO RELATED APPLICATIONS

The present application is a divisional application of application Ser. No. 10/934,599 filed on Sep. 3, 2004 now U.S. Pat. No. 7,133,312, which is a continuation of PCT/JP03/02094 filed Feb. 26, 2003.

TECHNICAL FIELD

This invention relates to a readout circuit for a semiconductor storage device, in particular a readout circuit for a semiconductor storage device having a memory cell including a tunnel magneto-resistive element.

BACKGROUND ART

FIGS. 21a and 21b show the structure and the principle of a tunnel magneto-resistive element, referred to below as TMR. Referring to FIG. 21a, a TMR 610 includes an insulating film 652 and magnetic layers 653, 654 formed on both sides thereof. The insulating film 652 has a thickness of 10 to 20 Å, while that of each of the magnetic layers 653, 654 is on the order of 50 Å. One 653 of the two magnetic layers 653, 654 is termed a pin layer having its direction of magnetization not changed by the application of the magnetic field within the operating range of the TMR but fixed to the direction of magnetization as set at the time of manufacture. The other magnetic layer 654, termed a free layer, has its direction of magnetization changed by the application of the magnetic field within the operating range of the TMR. FIG. 21a shows the state in which the free layer 654 is magnetized in a direction opposite to that of the pin layer 653. When an electric field is applied across the free layer 654 and the pin layer 653, the tunnel current flowing through the insulating film 652 is small, with the TMR exhibiting a high resistance value. If, in this state, a magnetic field, not less than a threshold value for inversion of magnetization of the free layer 654, is applied to the TMR 610 in a direction parallel to the direction of magnetization of the pin layer 653, the magnetization of the free layer 654 is reversed. FIG. 21b shows the state of the inversion of magnetization. If an electrical field is applied across the free layer 654 and the pin layer 653, the tunnel current flowing in the insulating film 652 becomes larger, with the resistance value of the TMR 610 being then decreased.

Such a semiconductor storage device, referred to below as MRAM, is known, in which the above-described resistance change of TMR is utilized such that the two resistance states of the TMR, for example, the high resistance state of FIG. 21a and the low resistance state of FIG. 21b are allocated to storage states of '1' and '0', respectively. FIGS. 22a and 22b are a plan view and a cross-sectional view for illustrating the operation of the MRAM memory cell, respectively. Referring to FIG. 22a, a word line 711 and a bit line 712 are arranged at right angles to each other on both sides, more precisely, on upper and lower sides, of the TMR 710. The directions indicated by solid-line arrows indicate the current-flowing directions. Referring to FIG. 22b, a TMR 710 is made up by an insulating film 752, a pin layer 753 and a free layer 754 on both sides of the insulating film 752, an anti-ferromagnetic layer 755, formed below the pin layer 753, and a cap layer 756. The anti-ferromagnetic layer 755 is provided for fixing the direction of magnetization of the pin layer 753 and for assuring facilitated inversion of only the direction of magnetization of the free layer 754. Consequently, the TMR 710 has a spin-valve structure. The cap layer 756 protects the anti-ferromagnetic layer 755 and the free layer 754. Data writing, that is, inversion of the direction of magnetization of the free layer 754, occurs by causing the current to flow through the word line 711 and the bit line 712. By the law of Ampere, when the current is flowing through the word line 711 and the bit line 712, in the direction shown in FIG. 22a, a magnetic field is generated in the free layer 754 from the lower side of the drawing sheet towards above in FIG. 22a, by the current flowing through the word line 711, whilst another magnetic field is generated in the free layer 754 from the left side towards the right side of the drawing sheet in FIG. 22a, by the current flowing through the bit line 712. Hence, a synthesized magnetic field acts on the free layer 754 in a direction proceeding from the lower left towards the upper right of the drawing sheet. If the direction of the current flowing through the word line 711 and the bit line 712 is reversed, the direction of the synthesized magnetic field, acting on the free layer 754, is reversed, and proceeds from the upper right side towards the lower left side. This reverses the magnetization of the free layer 754. Thus, data writing may be performed by controlling the direction of the current flowing through the word line 711 and the bit line 712.

Data readout may be realized by measuring the current flowing through the TMR or the voltage across both ends of the TMR to make indirect measurement of the resistance value of the TMR. If the resistance value of the TMR in the '0' storage state is R and that of the TMR in the '1' storage state is (R+ΔR), the MR ratio, defined by MR ratio=ΔR/R× 100(%), serves as an index indicating the operating margin of the TMR, and is usually 10 to 30%.

As typical of the MRAM, employing this TMR as a memory cell, a structure in which reference cells are arranged, in addition to the memory cells, in a memory cell array, is disclosed in the U.S. Pat. No. 6,205,073. The resistance value of the reference cell is fixed and is intermediate between the resistance value of the '0' storage state and that of the '1' storage state of the TMR forming the memory cell array. The stored data is read out by converting the current, flowing through the selected memory cell and the reference cell, into the voltage, in an amplifying fashion, and comparing the two voltage values. If the voltage obtained from the memory cell is smaller or larger than the voltage obtained from the reference cell, the storage state of the memory cell is '1' or '0', respectively.

However, the TMR, used as a storage element of the MRAM, is formed by an insulating film of an extremely small thickness and magnetic layers of extremely small thicknesses. It is noted that, for a constant voltage applied, the tunnel current traversing the insulating film, and hence the resistance value of the TMR, are changed exponentially against the thickness thereof. For example, when the thickness of the insulating film becomes thicker or thinner by one atomic layer (2 to 3 Å), the resistance value is varied by 20 to 30%. It is however difficult to generate a uniform insulating film with film thickness variations of the order of an atomic layer. These variations in the resistance value of the TMR become more outstanding as the TMR area is decreased. Thus, the MRAM of the above-described conventional art suffers from the problem that, even though the storage state of the memory cell is '1' or '0', the voltage obtained from the memory cell becomes larger or smaller than the voltage obtained from the reference cell, respectively, thus deteriorating the cell yield.

For overcoming the problem due to the variations in the resistance value of the TMR, there is disclosed in the U.S. Pat. No. 6,188,615 an MRAM in which the recording state may be read out by a self-referencing system, without employing the reference cell. FIG. 23 depicts a block circuit diagram of the MRAM of the prior art, which is composed of a memory cell array 802 and a readout circuit 801. The memory cell array 802 is formed by a matrix of memory cells each formed by a sole TMR 810 present at a point of intersection of a word line 811 and a bit line 812 lying at right angles to each other. During readout, only a cell selected by an X-selector and a Y-selector is connected to the readout circuit 801, such that only the current flowing through the selected cell by the voltage applied across both terminals of the selected cell is entered to the readout circuit 801. The readout circuit 801 is made up by an integrating means 830, a voltage comparator 808A, a counter 805, a preset register 807A, a decision means 808, a reference pulse generating means 834, and a control circuit 809. The integrating means 830 includes a charge amplifier 833 and an integrating capacitor 832.

The current flowing through the selected cell is converted in an amplifying fashion into voltage and integrated. The readout circuit 801 indirectly measures the resistance value of the selected cell by measuring the time Tint until the voltage Vint, integrated by the integrating means 830, becomes equal to the reference voltage Vr. The voltage comparator 808A compares the voltage Vint to the voltage Vr at all times and, by the counter 805 counting the number of reference pulses of a preset period, generated by the reference pulse generating means 834, during the time when Vint≦Vr, the time Tint is converted into a digital value proportionate to the counted number of pulses.

FIG. 24 depicts a view for explaining the operation of a readout circuit of FIG. 23. In a first readout, the number of pulses c1st(0), as counted by the counter 805 when the TMR of the selected cell is in the '0' storage state, is smaller than the number of pulses c1st(1), as counted by a counter 805 when the TMR of the selected cell is in the '1' storage state. This selected cell is then written to the state '0' or '1' and, in the second readout, as in the first readout, the number of pulses c2nd is counted by the counter 805 until Vint=Vr. In FIG. 24, the selected cell is written to the '0' storage state. The storage state of the selected cell for the first readout is determined by the count number of the first and the second readouts.

FIG. 25 depicts a flowchart for illustrating the operation of the readout circuit shown in FIG. 23. When a memory cell is selected (step S801), a count value CNT=d/2 is loaded in the counter 805 (step S802), where d=[c(0)−c(1)]. It is noted that c(0) and c(1) are the count numbers as counted by the counter 805 until the integrated voltage Vint is equal to the reference voltage Vr when the TMR is in the '0' storage state and in the '1' storage state, respectively. These are measured using e.g., an arbitrary memory cell in the memory array. In this case, d assumes a negative value. The first readout is then carried out (step S803). The count value CNT of the counter 805 is equal to the sum of the count value c1st, obtained by the first readout, and d/2. After [−(c1st+d/2)] is stored in the preset register 807A, the contents thereof are re-loaded in the counter 805 (step S804). The '0' storage state is then written in the selected cell (step S805). The second readout is then carried out (step S806). The count value CNT of the counter 805 is equal to the sum of the count value c2nd, obtained by the second readout, and the count value [−(c1st+d/2)] already loaded, that is, [c2nd−(c1st+d/2)]. The decision means 808 then verifies the sign of the CNT (step S807). If the CNT is positive, the storage state for the first readout of the selected cell is determined to be '0' (step S808). The readout operation then comes to a close. If the CNT is negative, the storage state for the first readout of the selected cell is determined to be '1' (step S809). If the storage state of the selected cell is determined to be '1', the '1' storage state is re-written in the selected cell as necessary (step S810) to terminate the readout operation.

By carrying out the readout twice, in this manner, the storage state of a cell in the MRAM may be checked by the self-referencing system, without using reference cells.

In the above-described self-referencing system, in which the difference between the '0' storage state and the '1' storage state of the memory cell itself is used for determining the storage state of the memory cell, it is possible to reduce the effect of the variations in the resistance values from one memory cell to another, In the above-described conventional technique, such a sequence of time-consuming operations consisting in loading d/2, as a constant, in a counter, or in reversing the sign of the count value of the counter after first readout, saving the count value in a preset register and in re-loading the contents in a counter, is required. For avoiding this inconvenience, it is sufficient if a register for storage of the results of the first readout is discretely provided, and the results of the first readout are then stored in this register until the second readout is finished. However, this needs a register circuit for several bits, thus increasing the circuit area. Moreover, an integrating capacitor, provided in the integrating means, also increases the circuit area. For example, if the resistance value of a sole TMR is 100 kΩ, the voltage drop across both terminals of the TMR is 0.5V, the voltage Vr is 0.5V and the integrating time is 1 µsec, the capacitance of 10 pF is needed as the capacitance of the integrating capacitor. For implementing the capacitance of 10 pF in the integrating circuit, an area not less than 40×40 µm² is needed, with the use of the gate capacitance. In addition, the PLL, routinely used as a reference pulse generating means, also acts for increasing the circuit area or power consumption.

DISCLOSURE OF THE INVENTION

In view of the above-depicted status of the art, it is an object of the present invention to provide a readout circuit for a non-volatile semiconductor storage device, exploiting a tunnel magneto-resistive device, in which it is possible to reduce the area of the device and power consumption, to achieve high-speed readout and to prevent the production yield from being lowered as a result of variations in the resistance value of the TMR.

In one aspect, the present invention provides a readout circuit for a semiconductor storage device comprising a measured value generating means for generating a measured value proportionate to the current entered from a selected one of a plurality of memory cells of a memory cell array, each memory cell having two storage states, namely a first storage state with a relatively low resistance value and a second storage state with a relatively high resistance value, a holding means for holding the measured value prior to the write timing to the selected cell, a comparator means for comparing the measured value as held to the measured value following the write timing, and a decision means for verifying the storage state of the selected cell prior to the write timing to the selected cell from the result of comparison and from the storage state resulting from writing to the selected cell.

In a second aspect, the present invention provides a readout circuit for a semiconductor storage device including a memory cell array, made up by a plurality of memory cells, each having two storage states, namely a first storage state with a relatively low resistance value and a second storage state with a relatively high resistance value, in which the readout circuit comprises a preamplifier for detecting the current entered from a selected one of the memory cells for conversion to a voltage, a voltage-controlled oscillator oscillated with a frequency proportionate to an output voltage of the preamplifier, a counter for counting the number of pulses output from the voltage-controlled oscillator, a count value storage means for holding an output value of the counter on memory, and a decision means supplied with output values of the counter and the count value storage means for verifying the storage state of the selected cell.

In a third aspect, the present invention provides a readout circuit for a semiconductor storage device, a memory cell array of which is formed by a plurality of memory cells each having two storage states, namely a first storage state with a relatively low resistance value and a second storage state with a relatively high resistance value, in which the readout circuit comprises a preamplifier for detecting the current entered from a selected one of the memory cells for converting the so detected current into voltage, a voltage storage means for holding an output voltage of the preamplifier on memory, and a voltage comparator means for comparing an output voltage of the preamplifier to an output voltage of the voltage comparator means.

In a fourth aspect, the present invention provides a readout circuit for a semiconductor storage device, a memory cell array of which is formed by a plurality of memory cells each having two storage states, namely a first storage state with a relatively low resistance value and a second storage state with a relatively high resistance value, in which the readout circuit comprises a preamplifier for detecting the current entered from a selected one of the memory cells for converting the so detected current into voltage, a first switch means for turning an output of the preamplifier on or off, an inverter connected downstream of the first switch means via a capacitor, a latch circuit connected downstream of the inverter, and a second switch means connected in parallel with the inverter.

In a fifth aspect, the present invention provides a readout circuit for a semiconductor storage device, a memory cell array of which is formed by a plurality of memory cells each having two storage states, namely a first storage state with a relatively low resistance value and a second storage state with a relatively high resistance value, in which the readout circuit comprises an integrating means for integrating the current entered from a selected one of the memory cells, a voltage storage means for holding on memory a voltage output from the integrating means, and a voltage comparator for comparing an output voltage of the integrating means to an output voltage of the storage means.

According to the present invention, the memory cell preferably includes a tunnel magneto-resistance element.

BRIEF DESCRIPTION OF THE DRAWINGS

FIG. 1 is a block circuit diagram of an MRAM used in a first embodiment of the present invention.

FIGS. 2a, 2b and 2c illustrate the operation of a preamplifier and a VCO of FIG. 1.

PREFERRED EMBODIMENT OF THE INVENTION

General Observation

A readout circuit of the present invention is applied to a memory cell array made up by memory cells each having a first storage state with a relatively low resistance value and a second storage state with a relatively high resistance value. In readout, a measured value proportionate to the current input from a selected one of memory cells, e.g., a voltage value, or the number of pulses, output from a voltage-controlled oscillator, is generated. A measured value prior to the write timing to the selected cell, is held, and the measured value thus held is compared to a measured value subsequent to the write timing. The state of storage prior to the write timing in the selected cell is determined from the result of comparison and the state of storage brought about by the writing in the selected cell. By this decision, it is possible to read out the storage state of the selected cell prior to the write timing.

Figure 26:
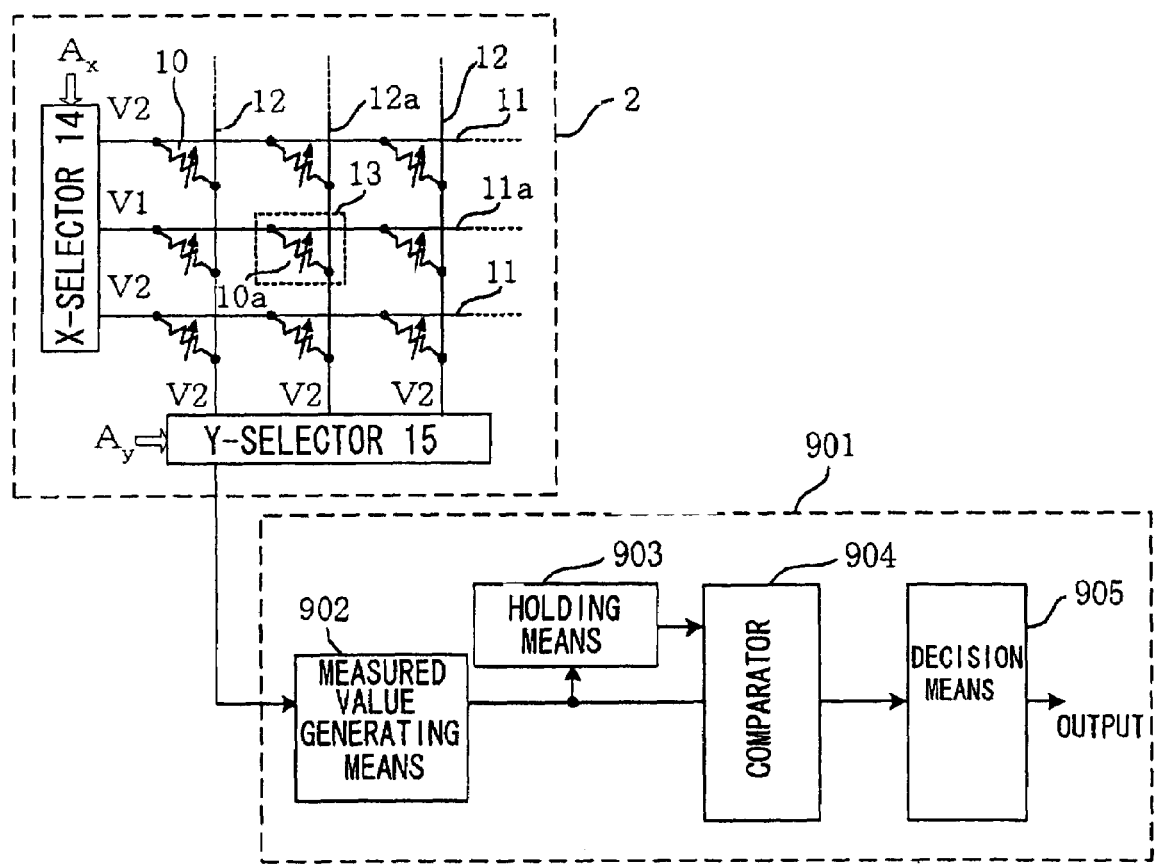
FIG. 26 is a block circuit diagram of an MRAM according to an embodiment of the present invention.

Referring to the drawings, an embodiment of the present invention is explained in detail. FIG. 26 is a circuit block diagram of an MRAM embodying the present invention. It may be seen from FIG. 26 that the MRAM used in the present embodiment includes a memory cell array 2 and a readout circuit 901. The memory cell array 2 is a cross-point cell array formed by a matrix array comprising a sole TMR 10 located in each intersection of one of plural word lines 11 and one of plural bit lines 12, with the word lines and the bit lines being arranged at right angles to each other. Although only three each of the word lines and bit lines are shown, for simplicity of illustration, hundreds to thousands of the word and bit lines are routinely used. In readout, a row address and a column address are applied to an X-selector 14 and to a Y-selector 15 to select a memory cell. A selected word line 11a, connected to a TMR 10a of a selected memory cell 13, is connected to a first power supply V1, whilst a selected bit line 12a is connected to an input terminal of the readout circuit. The other non-selected word and bit lines are connected to a second power supply V2. The input terminal voltage of the readout circuit is at all times at the same voltage as the second power supply V2. At this time, a voltage corresponding to the difference between the voltage of the first power supply V1 and the voltage of the second power supply V2 is applied across both ends of TMR 10a of the selected cell 13, and only the current flowing through the TMR 10a is supplied to the readout circuit 901.

The readout circuit 901 includes a measured value generating means 902, a holding means 903, a comparator 904 and a decision means 905. The measured value generating means 902 generates a measured value proportionate to the current supplied from the selected cell 13 of the memory cells, for example, a voltage value, or the number of pulses output from the voltage-controlled oscillator. The holding means 903 holds a measured value prior to the write timing to the selected cell 13. The comparator 904 compares a measured value held by the holding means 903 to the measured value subsequent to the write timing. From the result of comparison, output from the comparator 904, and from the storage state resulting from the writing in the selected cell 13, the decision means 905 verifies and outputs the storage state of the selected cell 13 that prevailed prior to the write timing in the selected cell 13.

By setting the measured value subsequent to the write timing to a value intermediate between the measured value prior to the write timing for the first storage state and the measured value prior to the write timing for the second storage state, in dependence upon the storage state for the writing in the selected cell, the decision means 905 for verifying the storage state prior to the write timing in the selected cell may be constructed relatively easily.

EMBODIMENTS

By referring to the drawings, preferred embodiments of the present invention will be explained in detail.

First Embodiment

FIG. 1 depicts a block circuit diagram of an MRAM used in a first embodiment of the present invention. Referring to FIG. 1, the MRAM of the present embodiment includes a memory cell array 2 and a readout circuit 1. The memory cell array 2 is the same as that explained with reference to FIG. 26 and hence is not explained here. Only the current flowing through the TMR 10a is supplied to the readout circuit 1. This readout circuit 1 includes a preamplifier 3 for converting the current flowing through the TMR of the selected cell into the voltage in an amplifying fashion, a VCO (voltage-controlled oscillator) 4 for oscillating at a frequency proportionate to the output voltage of the preamplifier 3, a counter 5 for counting the number of pulses of the VCO 4 during an optional period, a readout value register 6 for storage of an output value of the counter 5, a reference value register 7 for pre-storage of a reference decision value, a decision means 8 for verifying the storage state in the selected cell from the output values of the two registers 6, 7 and the counter 5, and a control circuit 9 for controlling the operation of the readout circuit 1. A reference decision value D, stored in the reference value register 7, has a value such that $0<D<|C(0)-C(1)|$, where $C(0)$, $C(1)$ are count values output from the counter 5 when the TMR of the memory cell is in the '0' storage state or in the '1' storage state, respectively. It is noted that $C(0)$, $C(1)$ may be found as count values of the counter 5 when an optional memory cell in the memory cell array is set to the '0' storage state and to the '1' storage state, respectively, and the memory cell is read out. Throughout the embodiments of the present invention, the '0' storage state or the '1' storage state represent the state in which the directions of magnetization of the pin layer and the free layer are parallel or anti-parallel to each other, respectively.

The preamplifier 3 outputs a voltage proportionate to the resistance value of the TMR of the memory cell with a negative gradient, as shown in FIG. 2a. $R(0)$, $R(1)$ are resistance values when the TMR of the memory cell is in the in the '0' storage state or in the '1' storage state, respectively, whilst V0, V1 are output voltages of the preamplifier 3 when the resistance value of the TMR of the memory cell is $R(0)$, $R(1)$, respectively. The output voltage may be adjusted by adjusting the gain of the preamplifier 3. The VCO 4 is oscillated at a frequency proportionate to an output voltage of the preamplifier 3, as shown in FIG. 2b. $f(0)$ and $f(1)$ denote oscillation frequencies of the VCO 4 when the output voltage of the preamplifier 3 is $V(0)$, $V(1)$, respectively. The oscillation frequency may be adjusted by adjusting the gain of the VCO 4. Thus, from FIGS. 2a and 2b, the VCO 4 oscillates at a frequency proportionate to the resistance value of the TMR of the memory cell with a negative gradient, as shown in FIG. 2c. The operational margin of the VCO, as well as the differential frequency $\Delta f$ between the oscillation frequency $f(1)$ for the '1' storage state and the oscillation frequency $f(0)$ for the '0' storage state, may be adjusted by the gain of the input/output characteristics of the preamplifier 3 and by the gain of the VCO 4.

Meanwhile, the circuitry may be designed so that the oscillation frequency of the VCO will be proportionate to the resistance value of the TMR of the memory cell with a positive gradient. It is unnecessary that a complete proportionate relationship holds between the oscillation frequency of the VCO and the resistance value of the TMR of the memory cell, it being only sufficient that there holds a monotonous changing relationship.

Figure 3:
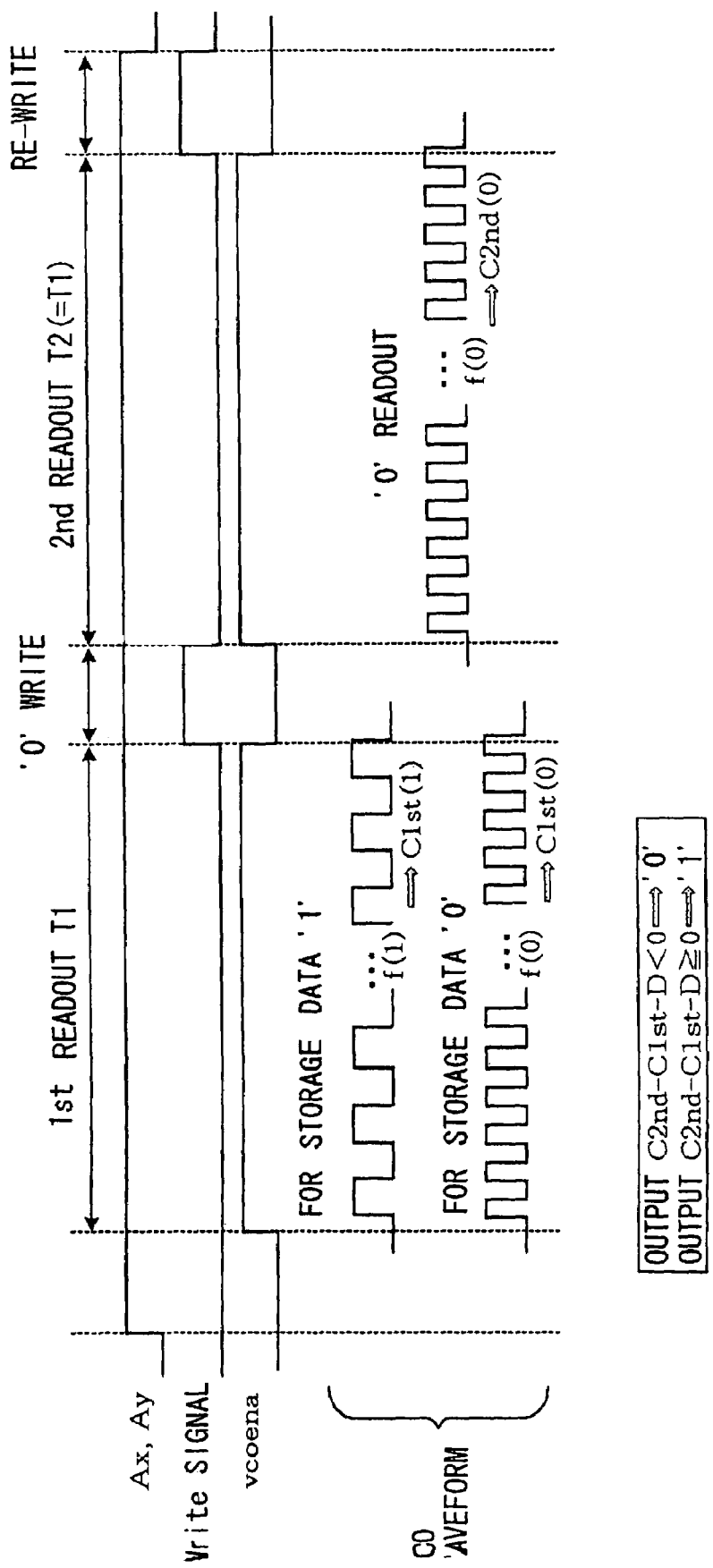
FIG. 3 illustrates the operation of a readout circuit of FIG. 1.

Referring to FIGS. 1 and 3, particularly to FIG. 3, the operation of the readout circuit 1 of the present embodiment is now explained. FIG. 3 illustrates the operation of the readout circuit 1. First, an optional memory cell is selected, and subsequently, the first readout of the memory cell is started. The first readout is by converting the current flowing through the TMR of the selected cell into the voltage by the preamplifier 3 of FIG. 1, generating pulses of an oscillation frequency, proportionate to the output voltage of the preamplifier 3, by the VCO 4, and by counting the number of pulses within a preset time by the counter 5. The count value C1st, output from the counter 5, is stored in the readout value register 6. The count value of the counter 5 is reset to zero. After writing so that the selected cell is in the '0' storage state, the second readout operation is started. This second readout is carried out in the same way as the first readout. The readout time for the second readout is set so as to be equal to that for the first readout. The count value output at this time from the counter is C2nd. The decision means 8 verifies the storage state of the selected memory cell for the first readout based on the following formulas:

'0' storage state if C2nd−C1st−D<0

'1' storage state if C2nd−C1st−D≧0

If the storage state of the selected memory cell during the first readout is verified by the decision means 8 to be the '1' storage state, writing is made so that the selected cell will assume the '1' storage state, after the end of the second readout operation, as necessary, to terminate the readout operation.

The second readout may be started after writing not the '0' storage state but the '1' storage state in the selected cell following the first readout. In this case, the decision means 8 verifies the storage state of the selected memory cell during the first readout based on the following formulas:

'1' storage state if C2nd−C1st+D≧0

'0' storage state if C2nd−C1st+D<0

If the decision means 8 has verified that the storage state of the selected memory cell during the first readout is the '0' storage state, writing is made so that, after the end of the second readout, the selected cell will assume the '0' storage state, to terminate the readout operation.

Figure 4:
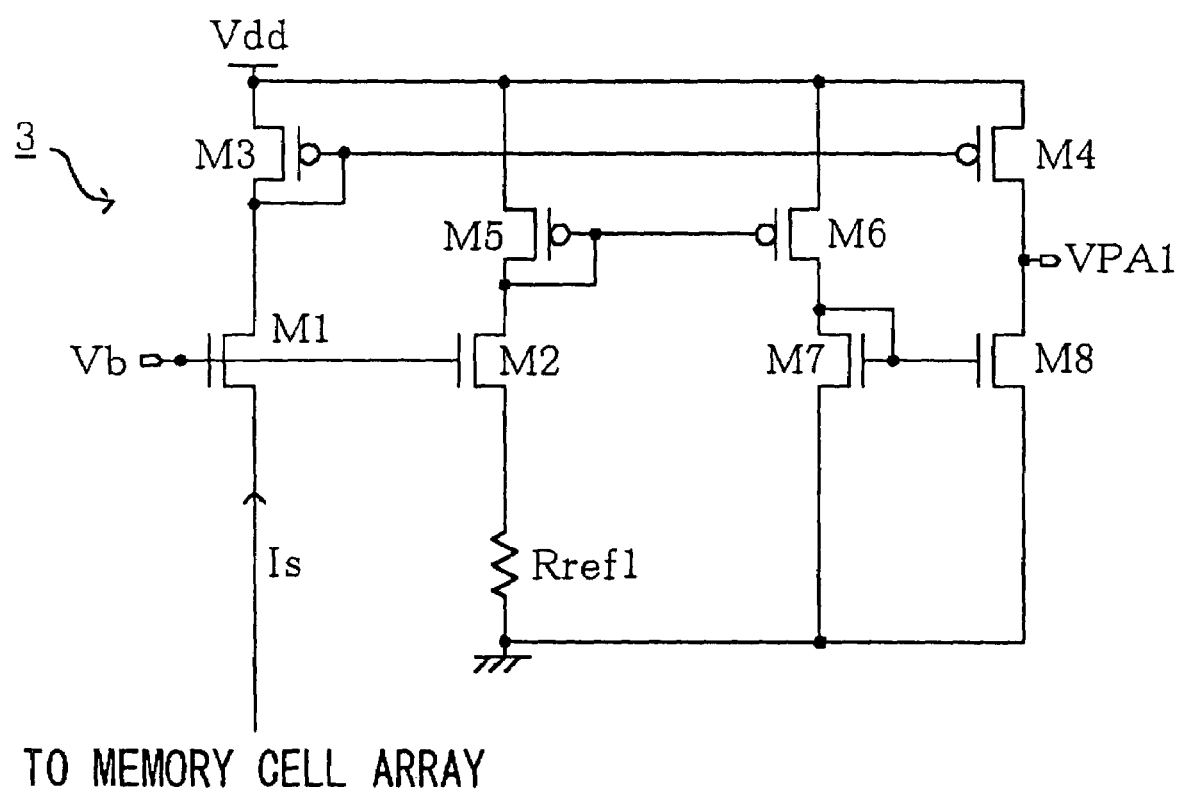
FIG. 4 is a circuit diagram of the preamplifier of FIG. 1.

FIG. 4 depicts a circuit diagram of the preamplifier 3 of FIG. 1. The circuit of the preamplifier 3 has a function of converting the current flowing through the selected cell into the voltage, in an amplifying fashion, as the voltage of an input terminal connected to the selected bit line in the memory cell array at the same voltage V2 as the voltage of the second power supply. The voltage conversion range is set within the input voltage range of the VCO 4 of FIG. 1. In FIG. 4, the source terminal of a transistor M1 is connected to a selected bit line, and a bias voltage Vb is applied to the gate of the transistor M1 so that the voltage of the source is equal to V2. The voltage Vb is such that Vb is nearly equal to V2+Vt, where Vt is a threshold voltage of the transistor M1. At this time, the current Is flowing across the drain and the source of the transistor M1 is equal to the current flowing through the TMR of the selected cell, and is given by the following equation:

$$Is=(V1-V2)/R \quad (1)$$

where R is a resistance value of the TMR. The transistors M3 and M4 make up a current mirror circuit, such that the current Is equal to the equation (1) flows across the drain and the source of the transistor M4. On the other hand, by two current mirror circuits, that is, the circuit formed by the transistors M5 and M6 and the circuit formed by the transistors M7 and M8, the current Ir equal to the current flowing through a resistor Rref1 flows across the drain and the source of the transistor M8. The resistance of the resistor Rref1 is set so that the current flowing across the drain and the source of the transistor M8 will be approximately equal to the current given by the equation (1). That is, the resistance value of the resistor Rref1 is set so that an operating point of the preamplifier will be adjusted in dependence upon the resistance value of the TMR. An output voltage VPA1 of the preamplifier is given by the following equation:

$$VPA1=Is \times RM8$$

where RM8 is a drain-to-source resistance of the transistor M8. In this manner, the current Is flowing through the selected cell is converted into the voltage, which may be amplified by increasing the drain-to-source resistance RM8 of the transistor M8.

Figure 5:
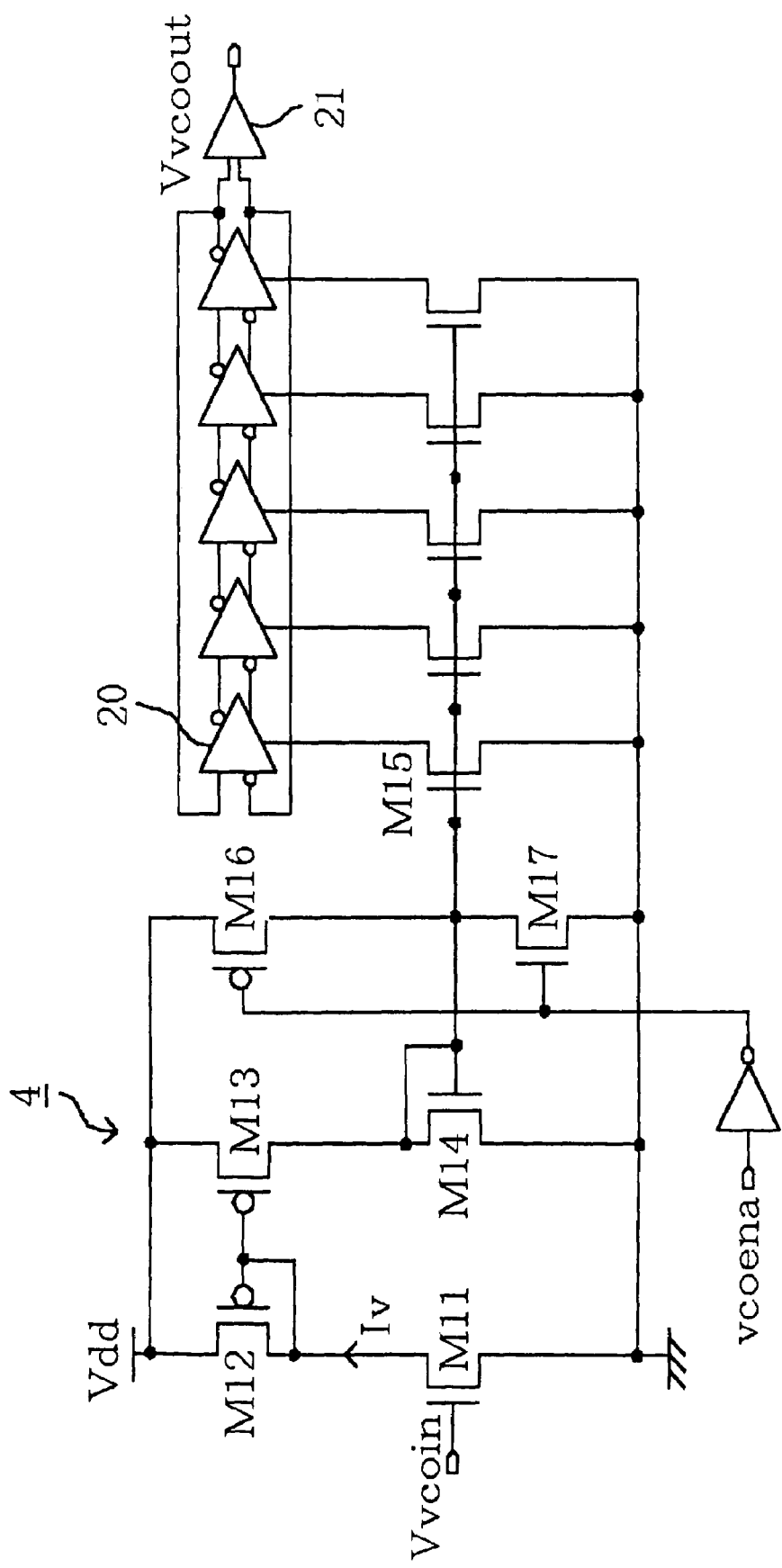
FIG. 5 is a circuit diagram of the VCO of FIG. 1.

FIG. 5 depicts a circuit diagram of the VCO 4. This circuit is a routine ring oscillator type VCO circuit including an odd number of stages of delay cells 20. An output voltage VPA1 of the preamplifier is input, as an input voltage Vvcoin to the VCO, to the gate of a transistor M11, so that a current Iv flows across the drain and the source of the transistor M11. Transistors M12, M13 and transistors M14, M15 make up two current mirror circuits so that the current Iv is caused to flow through the respective delay cells. The current Iv is changed in proportion to the input voltage Vvcoin, such that the time constant of each delay cell 20 is changed, with the result that the oscillation frequency of the VCO is changed. If the input voltage Vccoin falls below the threshold value of the transistor M11, the current ceases to flow through the transistors M11 to M15, such that oscillation of the VCO ceases. By setting the enable signal vcoena to "high", a transistor M16 is turned on and hence operates to prevent the gate voltage of the transistor M15 from falling below the threshold voltage to prevent the cessation of oscillation of the VCO. If the enable signal vcoena is set to "low", a transistor M17 is turned on to lower the gate voltage of the transistor M15 to below the threshold voltage to halt the oscillation of the VCO. Since the output voltage of each delay cell is extremely small, it is amplified by a differential amplifier 21 to a logic level voltage to give an output Vvcoout.

Figure 6:
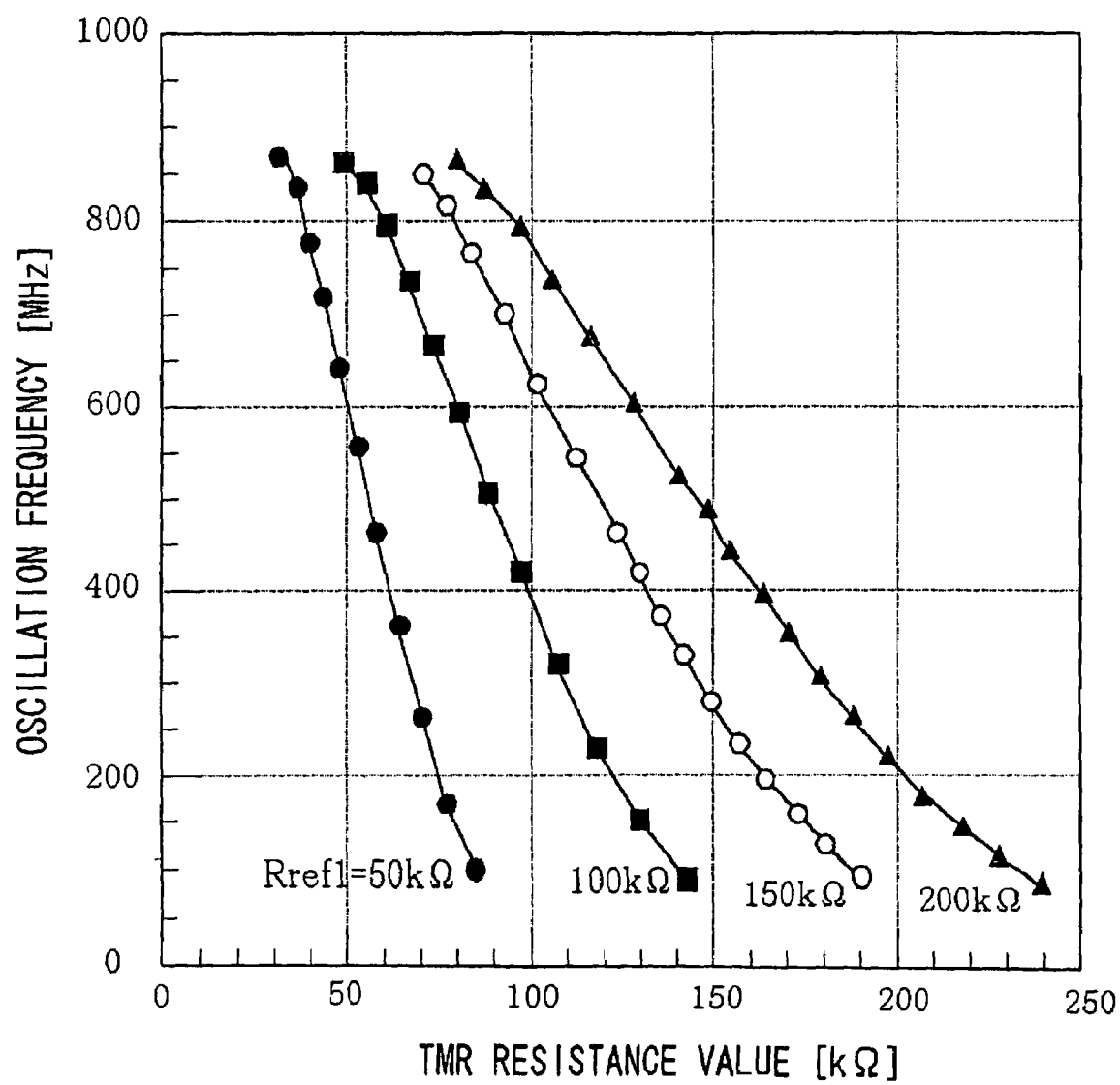
FIG. 6 is a graph showing TMR resistance-oscillation characteristics in the preamplifier circuit of FIG. 4 and a VCO circuit of FIG. 5.

FIG. 6 shows the TMR resistance-oscillation frequency characteristic obtained on SPICE simulation employing the preamplifier 3 shown in FIG. 4 and the VCO 4 shown in FIG. 5. The operational margin of the TMR resistance or the oscillation frequency difference Δ f may be adjusted by varying the resistance value of the resistance Rref1 of the preamplifier 3. For example, if Rref1=100 kΩ, it is possible to read out up to the memory cell with the TMR resistance value of 50 to 150 kΩ, such that, with the MR ratio=10%, the oscillation frequency difference Δf is approximately 100 MHz. With the first readout time T1 and the second readout time T2 being each 1 μsec, the difference between the count values of the '1' storage state and the '0' storage state is approximately 100, such that, with D of the order of 50, the 1' storage state and the '0' storage state may readily be discerned from each other.

Figure 23:
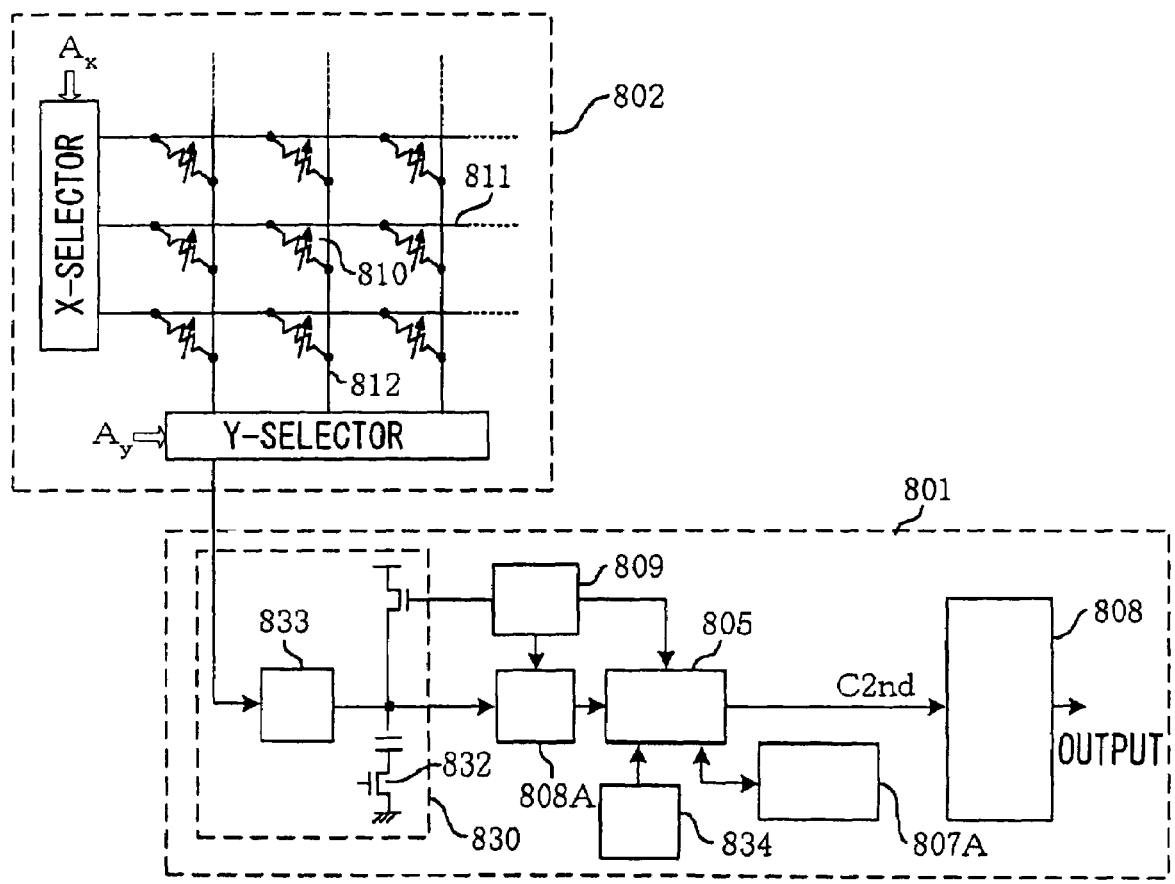
FIG. 23 is a circuit block diagram of a conventional MRAM.
Figure 24:
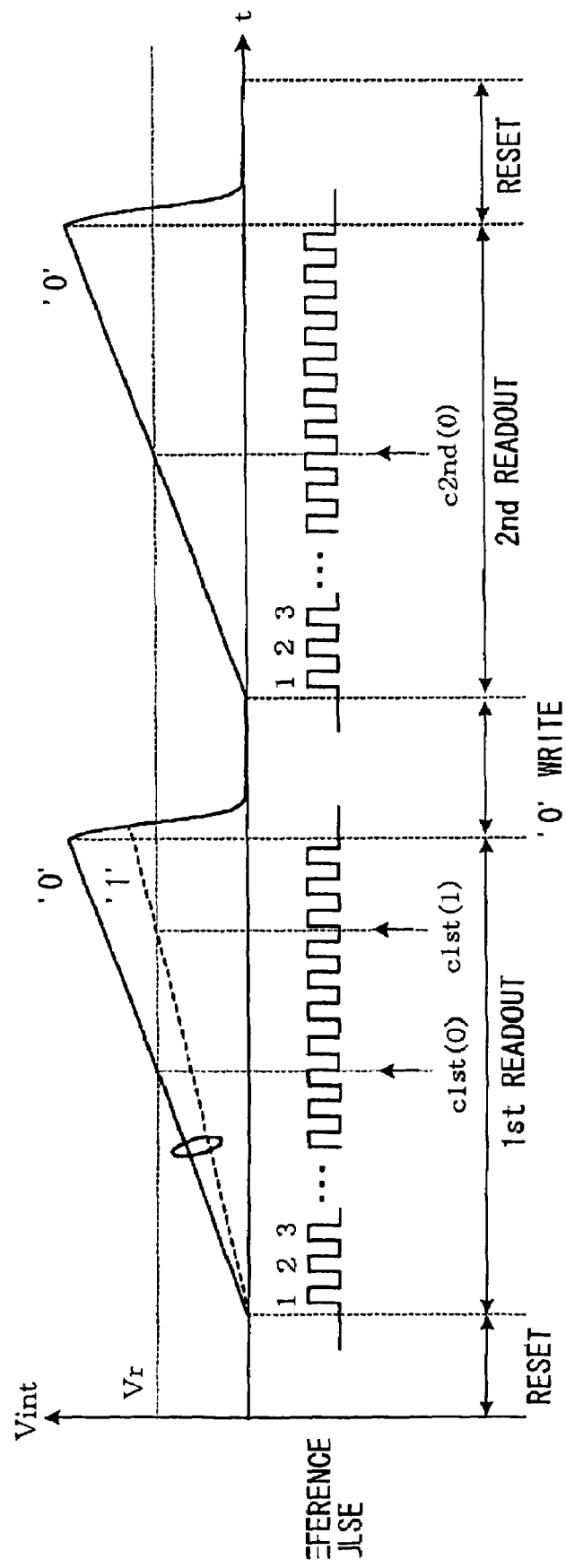
FIG. 24 illustrates the operation of the readout circuit of FIG. 23.
Figure 25:
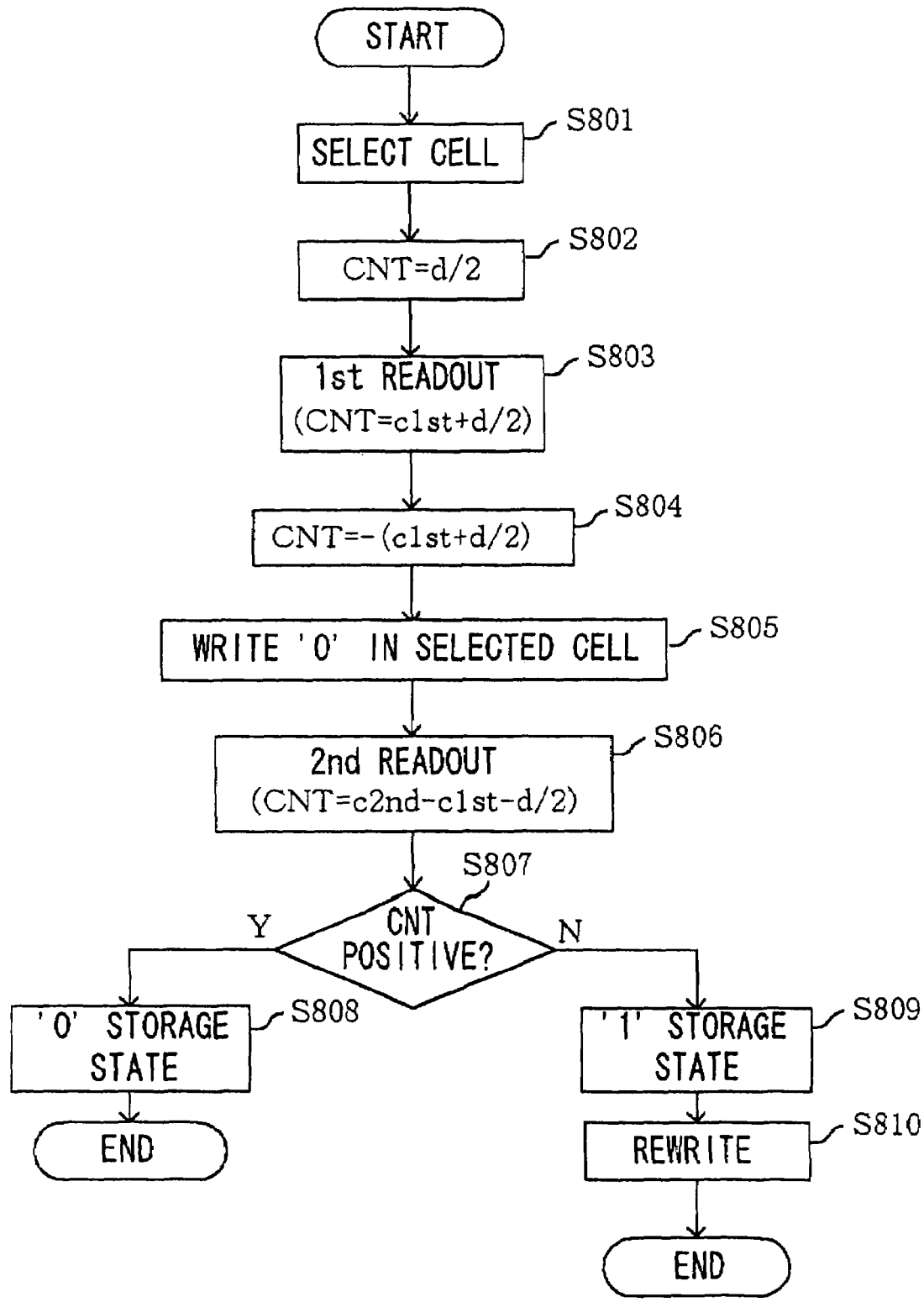
FIG. 25 is a flowchart for illustrating the operation of the readout circuit of FIG. 23.

With use of the VCO, digitization may be accomplished readily. Moreover, since the VCO has an integrating function on the phase axis, it is possible to eliminate the wraparound current or the ac-related noise current, as in integrating means 830 of the prior art shown in FIG. 23. In addition, the integrating means 830 and reference pulse generating means 834 used in the readout circuit 801 of the prior art shown in FIG. 23 may be eliminated, thereby reducing the circuit area and the power consumption. Moreover, such processing as loading d/2 on a counter or reversing the sign of the count value of the counter after the first readout for storage in a preset register to re-load the contents on a counter, is not needed, thereby enabling high-speed readout. In addition, the readout circuit 1 of the present embodiment is not in need of high precision on the voltage axis, while the VCO is a circuit operating digitally on the voltage axis, thus enabling a low-voltage operation. Furthermore, if manufactured by an ultra-fine process, the VCO may be oscillated at a higher frequency, thus contributing to manufacture of a mini-size device.

Second Embodiment

Figure 7:
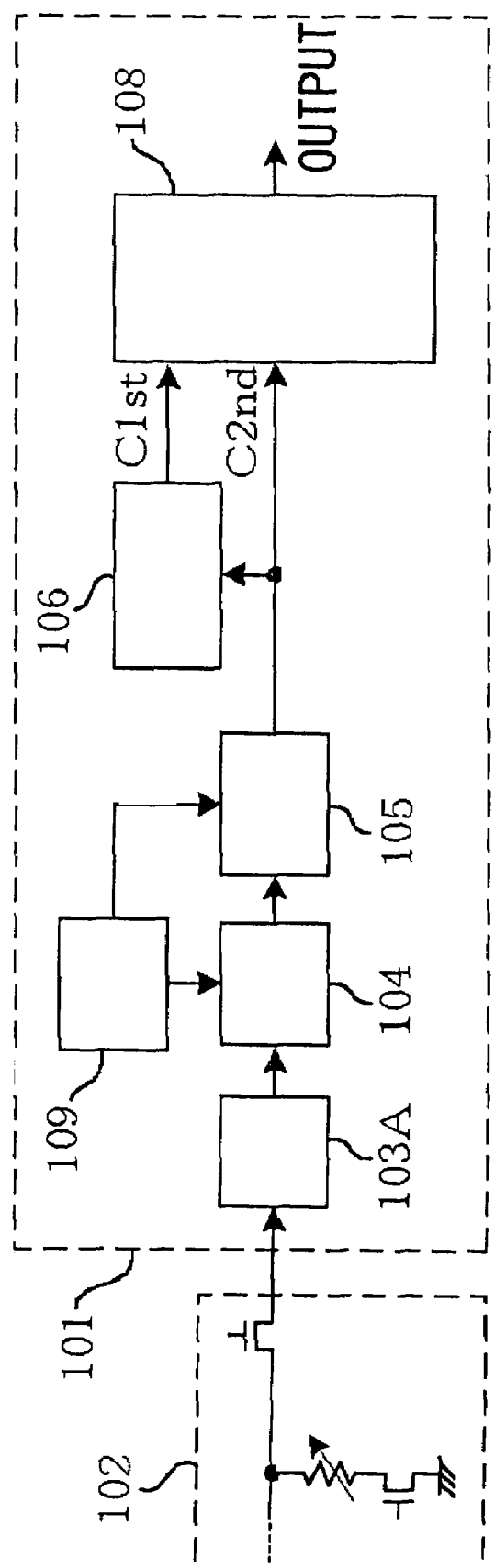
FIG. 7 is a circuit block diagram of a readout circuit of a second embodiment of the present invention.

FIG. 7 depicts a block circuit diagram of a readout circuit of the second embodiment of the present invention. Referring to FIG. 7, a readout circuit 101 of the present embodiment includes a gain-controllable preamplifier 103A for amplifying the current flowing through the selected cell into voltage and for controlling the conversion gain, a VCO 104 oscillating at a frequency proportionate to the output voltage of the gain-controllable preamplifier 103A, a counter 105 for counting the number of oscillation pulses of the VCO 104 during an optional preset period, and a readout value register 106 for storage of an output value of the counter 105. The readout circuit also includes a decision means 108 for verifying the previous storage state in the selected cell from the output values of the readout value register 106 and the counter 105, and a control circuit 109 for controlling the operation of the readout circuit 101. In FIG. 7, the component parts having the functions which are the same as or similar to those shown in FIG. 1 are indicated by reference numerals having common lowermost digits and are not explained in detail.

To an input of the gain-controllable preamplifier 103A is connected a memory cell array which is of the same structure as that of the memory cell array 2 of the first embodiment described above. The reference numeral 102 denotes a sole memory cell by way of illustrating a memory cell array connected to the input of the gain-controllable preamplifier 103A. Two N-channel MOSFETs denote an X-selector and a Y-selector. In case the two N-channel MOSFETs are turned on, one end of the cell is connected to the first power supply V1, while the other end thereof is connected to the input of the gain-controllable preamplifier 103A, this input being maintained at the same voltage as the second power supply V2. In the present embodiment, the first power supply V1 is at the ground potential.

Figure 8:
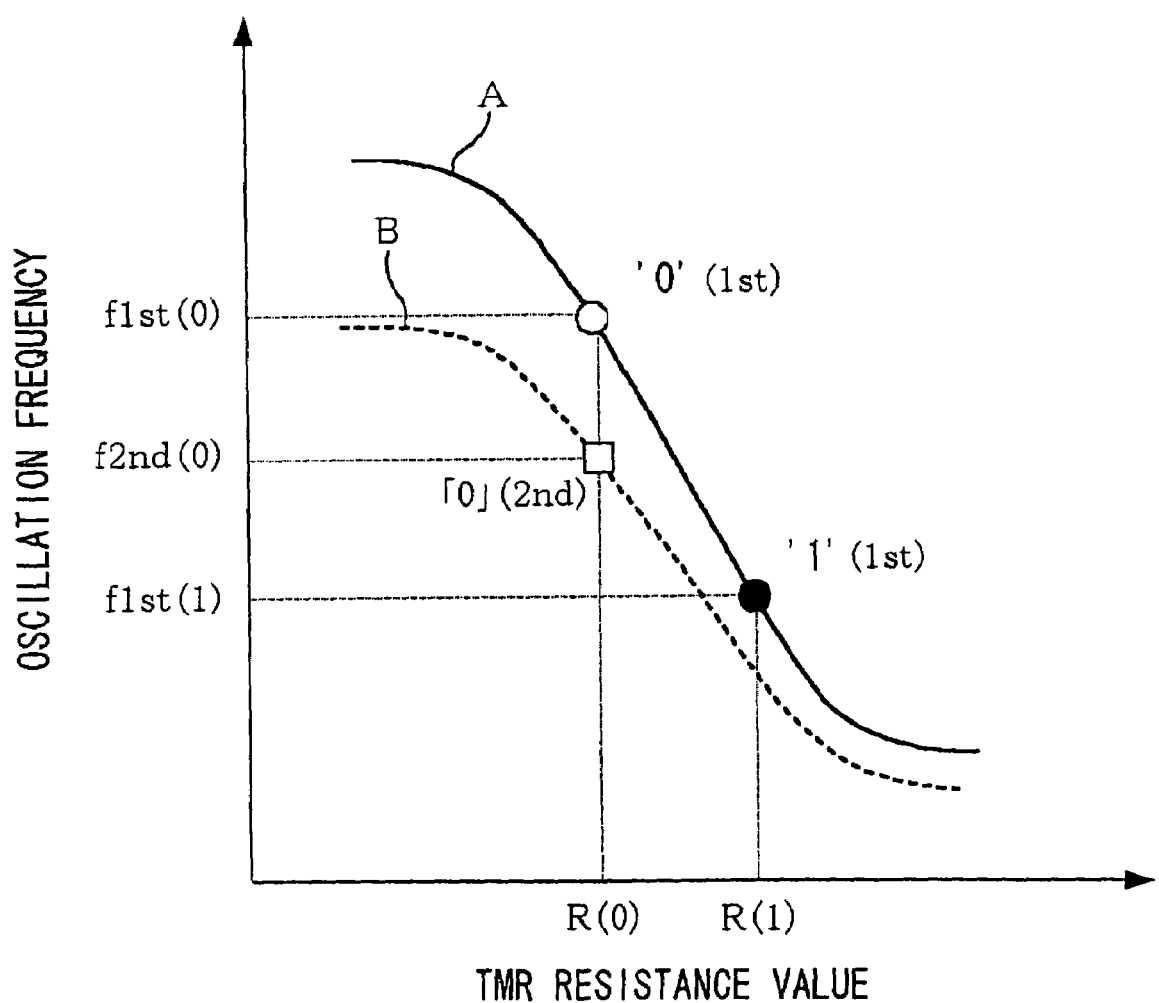
FIG. 8 is a graph for illustrating the operation of a gain control preamplifier and a VCO of FIG. 7.

FIG. 8 shows how the VCO oscillation frequency is changed with respect to the resistance value of the TMR of the memory cell, as in FIG. 2c of the first embodiment described previously. In FIG. 8, a curve A plots changes in the VCO oscillation frequency obtained when the gain of the gain-controllable preamplifier 103A is set to an optional value, whilst a curve B plots changes in the VCO oscillation frequency obtained when the gain of the gain-controllable preamplifier 103A is slightly lower than with the curve A.

In the present embodiment, as in the first embodiment, the readout operation by the self-referencing system by the first readout and the second readout is performed. In the first readout, the gain of the gain-controllable preamplifier 103A which gives the curve A of FIG. 8 is used, whereas, in the second readout, the gain of the gain-controllable preamplifier 103A which gives the curve B of FIG. 8 is used. A gain A1st of the gain-controllable preamplifier 103A used for the first readout and a gain A2nd of the gain-controllable preamplifier 103A used for the second readout are adjusted so that the following relationship:

$$f1st(1) < f2nd(0) < f1st(0)$$

may be obtained, where f1st(0) is the oscillation frequency of the VCO when the TMR is in the '0' storage state in the gain A1st, f1st(1) is the oscillation frequency of the VCO when the TMR is in the '1' storage state in the gain A1st, and f2nd(0) is the oscillation frequency of the VCO when the TMR is in the '0' storage state in the gain A2nd.

Figure 9:
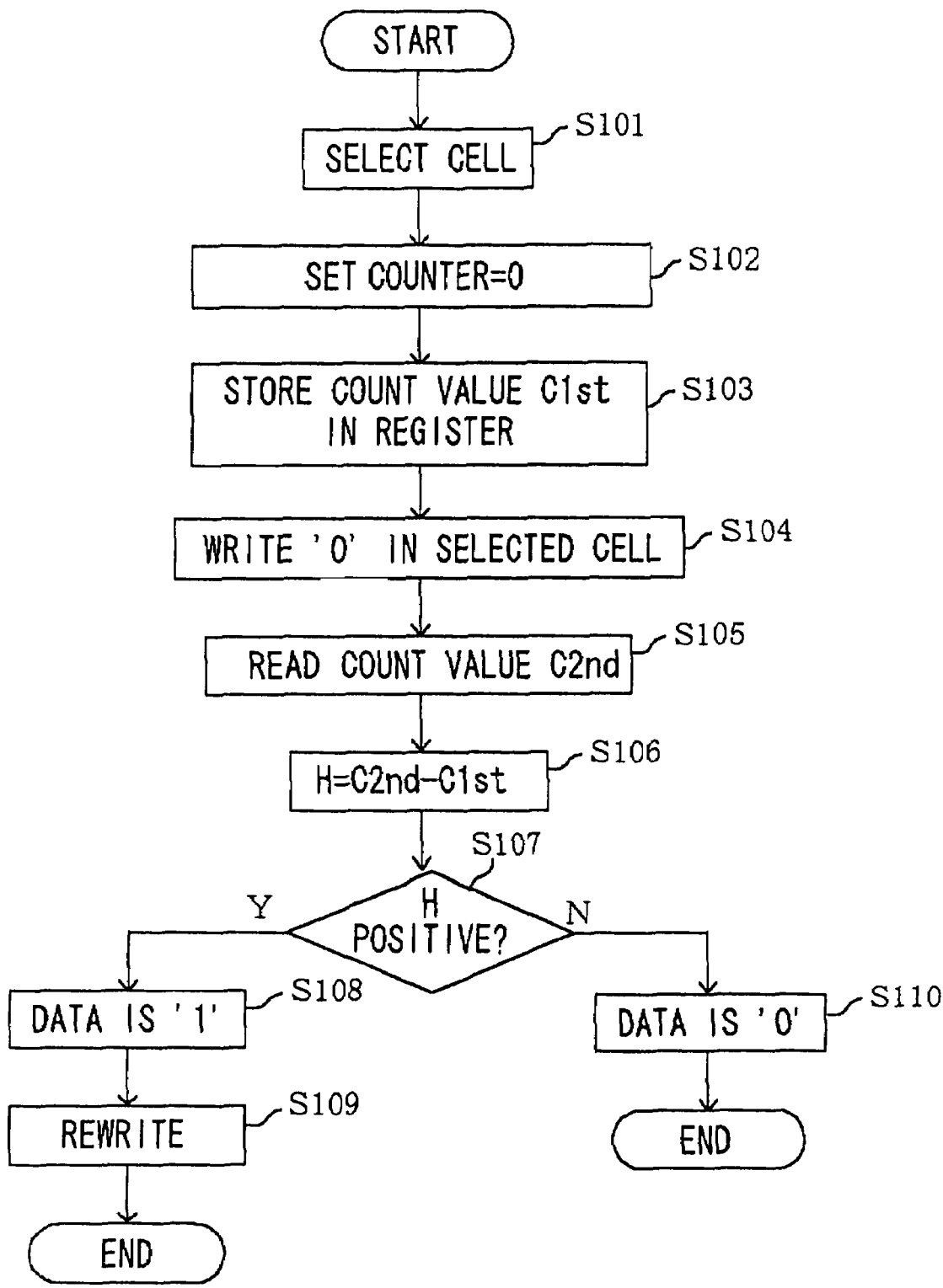
FIG. 9 is a flowchart for illustrating the operation of a readout circuit of FIG. 7.

Referring to the flowchart of FIG. 9, the operation of the readout circuit of FIG. 7 is explained.

S101: A cell is selected.
S102: The count value of the counter 105 is set to 0.
S103: The first readout is executed. After the output value C1st of the counter 105 is stored in the readout value register 106, the count value of the counter 105 is set to 0.
S104: The '0' storage state is written in the selected cell.
S105: The second readout is carried out. The count value of the counter 105 is C2nd.
S106: The decision means 108 calculates the value of H=C2nd−C1st.
S107: The decision means 108 verifies whether or not H is of a positive value.
S108: If H is of the positive value, the storage state in the first readout of the selected cell is determined to be '1'.
S109: If necessary, the '1' storage state is re-written in the selected cell to complete the readout operation.
S110: Except if H is of a positive value, the storage state during the first readout of the selected cell is determined to be '0' to terminate the readout operation.

The first readout time is equal to the second readout time, as in the first embodiment.

Meanwhile, the '1' recording state, in place of the '0' recording state, may be written after the first readout of the selected cell. In this case, the gain A2nd of the gain-controllable preamplifier 103A in the second writing is set so as to be larger than the gain A1st of the gain-controllable preamplifier 103A in the first writing. The gain A1st and the gain A2nd are adjusted so that the following relationship:

$$f1st(1) < f2nd(1) < f1st(0)$$

will be obtained among f1st(0), f1st(1) and f2nd(1) (oscillation frequency of the VCO when the TMR is in the '1' storage state in the gain A2nd of the gain-controllable preamplifier 103A used for the second readout).

As in the case of writing the '0' storage state after the first readout of the selected cell, the decision means 108 verifies whether or not H=C2nd−C1st is positive. If H is positive, the storage state of the selected cell in the first readout is determined to be '1', whereas, if H is not positive, the storage state of the selected cell in the first readout is determined to be '0'.

Figure 10:
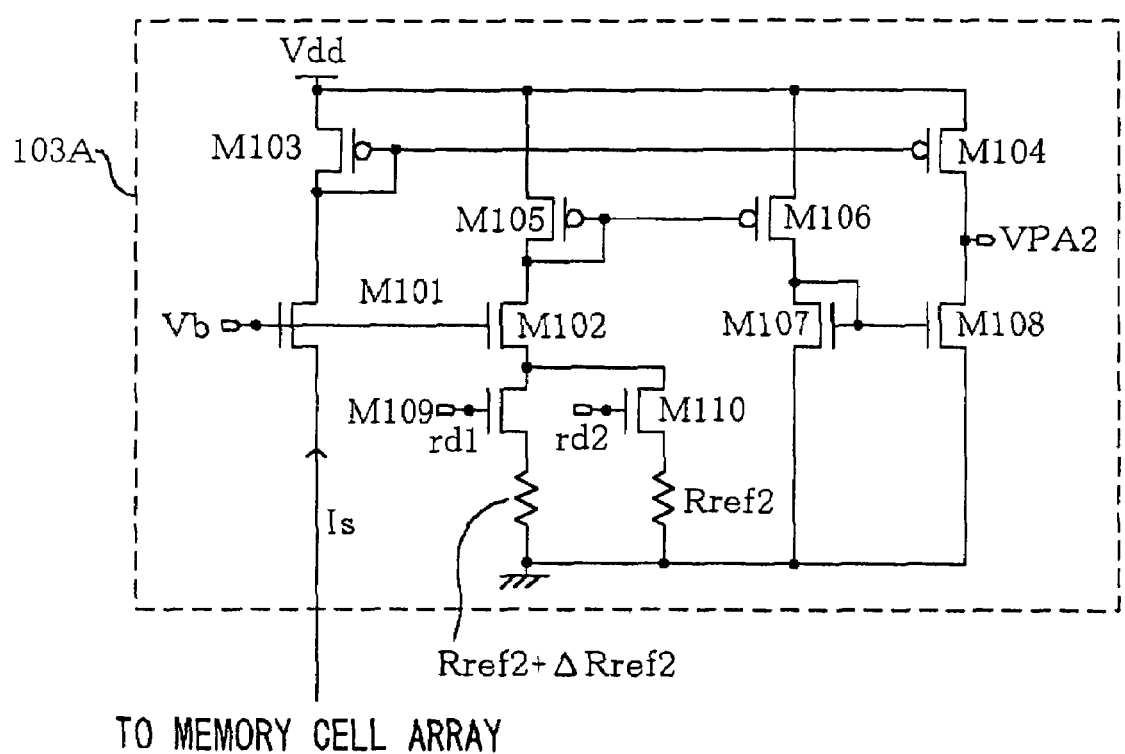
FIG. 10 is a circuit diagram of the gain control preamplifier of FIG. 7.

FIG. 10 depicts a circuit diagram of the gain-controllable preamplifier 103A of FIG. 7. In FIG. 10, the component parts having the functions which are the same as or similar to those shown in FIG. 4 are indicated by reference numerals having common lowermost digits and are not explained in detail. This gain-controllable preamplifier has the function of converting the current flowing through the selected cell into voltage, in an amplifying fashion, as the voltage of an input terminal connected to the selected bit line in the memory cell array is maintained at the same voltage V2 as the second power supply voltage. Moreover, the gain-controllable preamplifier is able to change the gain and/or the operating point. The range of the voltage for conversion is set within the range of the input voltage to the VCO 104 of FIG. 7. The operating principle of the gain-controllable preamplifier 103A is similar to that of the preamplifier 3 of FIG. 4. An output voltage VPA2 is given by the following equation:

$$VPA2 = Is \times RM108$$

Thus, the operating point and the gain of the gain-controllable preamplifier 103A are changed by adjusting the drain-to-source voltage RM108 of M108. In FIG. 10, the reference resistance, connected to M102, is provided in two stages which are changed over to adjust the value of RM108. More specifically, during the first readout, M109 and M110 are rendered conductive and non-conductive, respectively, to set the resistance connected to M102 to (Rref2+ΔRref2). During the second readout, M109 and M110 are rendered non-conductive and conductive, respectively, to set the resistance connected to M102 to Rref2.

Figure 11:
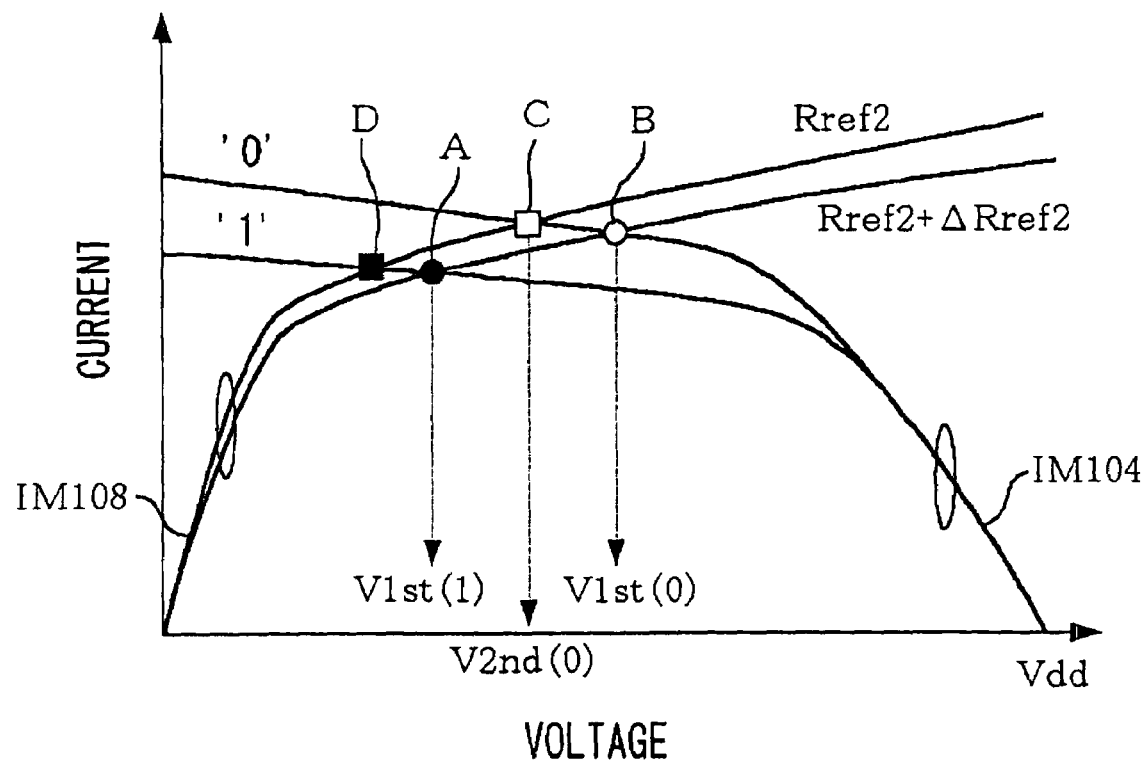
FIG. 11 is a graph for illustrating the operation of the gain control preamplifier of FIG. 10.

FIG. 11 shows the currents IM108 and IM104 flowing through the transistors M108, M104, respectively, when the voltage of 0 to Vdd is applied to an output point of the gain-controllable preamplifier of FIG. 10. The points of intersection of these currents represent stable operating points of the gain-controllable preamplifier 103A. Of these, the point of intersection A stands for the stable operating point for the '1' storage state of the selected cell for the first readout, the point of intersection B stands for the stable operating point for the '0' storage state of the selected cell for the first readout, and the point of intersection C stands for the stable operating point for the '0' storage state of the selected cell for the second readout. The point of intersection D stands for the stable operating point for the '1' storage state of the selected cell for the second readout, however, if the selected cell is written to the '0' storage state after the first readout, the point of intersection D is a meaningless point.

With the voltages of V1st(1), V1st(0) and V2nd(0) for the points of intersection A to C, respectively, Rref2 and ΔRref2 are selected so that V1st(1)<V2nd(0)<V1st(0). Theoretically, the ΔRref2/Rref2 ratio is set to approximately ½ of the MR ratio. By determining the values of Rref2 and ΔRref2 in this manner, the TMR resistance-VCO oscillation frequency characteristic, satisfying the relationship of V1st(1)<V2nd(0)<V1st(0), as shown in FIG. 9, is obtained. The foregoing refers to the case where the selected cell is written to the '0' storage state after the first readout. However, if the selected cell is written to the '1' storage state after the first readout, it is sufficient if M109, M110 are set to the non-conductive state and to the conductive state, respectively, for the first readout, M109, M110 are set to the conductive state and to the non-conductive state, respectively, for the second readout, and the values of Rref2 and ΔRref2 are then determined by the same procedure as that described above. In this case, the relationship of V1st(1)<V2nd(1)<V1st(0) is to be maintained.

By converting the current flowing through the selected cell into the voltage with different value of the gain for the first readout and for the second readout, the reference value register, needed for the first embodiment, may be deleted. Moreover, in the decision by the decision means 108, decision may be given without introducing the decision reference value as needed in the first embodiment, so that it is possible to reduce the circuit scale of the decision means.

Third Embodiment

Figure 12:
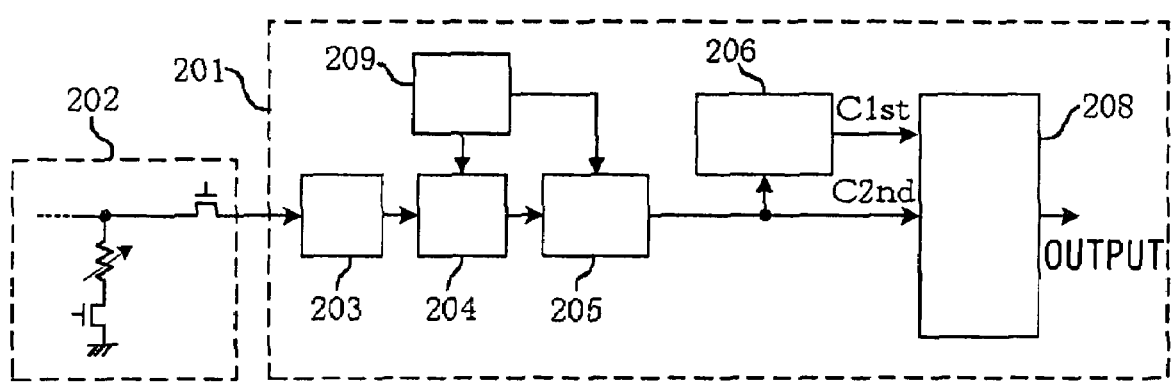
FIG. 12 is a circuit diagram of a readout circuit of a third embodiment of the present invention.

FIG. 12 depicts a circuit diagram of a readout circuit of a third embodiment of the present invention. Referring to FIG. 12, a readout circuit 201 of the present embodiment includes a preamplifier 203 for amplifying the current flowing through the selected cell into voltage, in an amplifying fashion, a VCO 204 oscillating at a frequency proportionate to the output voltage of the preamplifier 203, a counter 205 for counting the number of oscillation pulses of the VCO 204, and a readout value register 206 for storage of an output value of the counter 205. The readout circuit also includes a decision means 208 for verifying the previous storage state in the selected cell from the output values of the readout value register 206 and the counter 205, and a control circuit 209 for controlling the operation of the readout circuit 201. In FIG. 12, the component parts having the functions which are the same as or similar to those shown in FIG. 1 are indicated by reference numerals having common lowermost digits and are not explained in detail.

To an input of the preamplifier 203 is connected a memory cell array 202 which is of the same structure as that of the memory cell array of the first and second embodiments described above.

The preamplifier 203 used is of the same structure as that of the preamplifier 3 of FIG. 4. The VCO 204 used is of the same structure as the VCO 4 of FIG. 5. The start/stop of the oscillation of the VCO is controlled by an enable signal vcoena (not shown).

In the present embodiment, the first readout time T1 is set so as to be longer than the second readout time T2. With T1=T2+ΔT, the ΔT is preferably on the order of ½ of the MR ratio.

Figure 13:
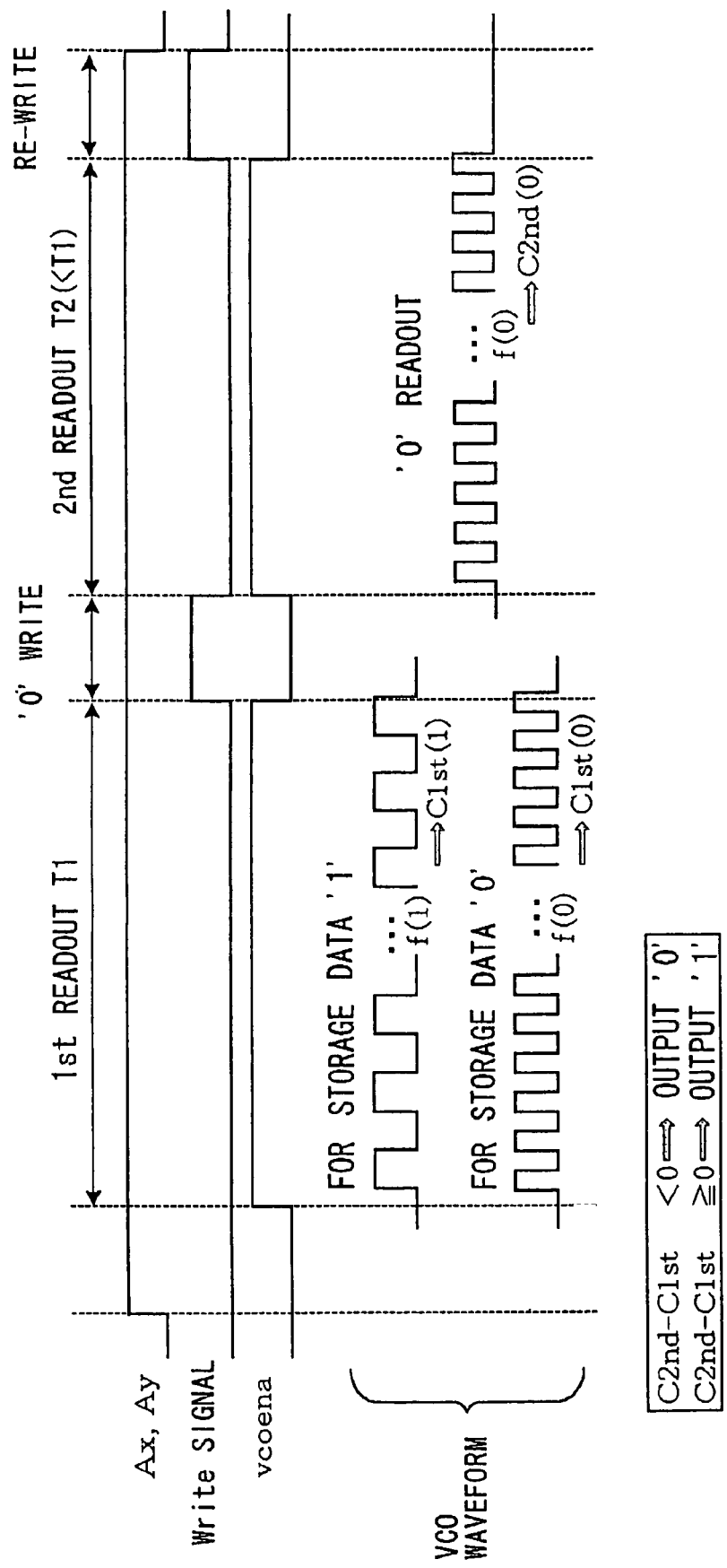
FIG. 13 illustrates the operation of a readout circuit of FIG. 12.

Referring to FIG. 13, the readout operation by the self-referencing system by the first readout and by the second readout is carried out in the present embodiment. In FIG. 13, the number of pulses read out by a counter in the readout in the readout time T1 is larger for the '0' storage state of the selected cell than for the '1' storage state of the selected cell, as in the first embodiment described above. The readout time T2 of the second readout is set so that the number of pulses read out when the memory cell read out by the second readout is in the '0' storage state will be intermediate between the number of pulses read out in the '0' storage state of the memory cell and that read out in the '1' storage state of the memory cell, in the readout with the first readout time T1.

The readout operation is carried out as follows: First, an optional memory cell is selected, and the count value C1st is counted in the counter 205 by the first readout operation of the memory cell. The count value C1st is stored in the readout value register 206. The count value of the counter is reset to 0. Then, after writing the selected cell to the '0' storage state, the second readout operation is carried out and the count value C2nd is counted in the counter 205. The decision means 208 verifies the storage state of the selected memory cell during the first readout in accordance with the following formulas for decision:

If C2nd−C1st<0 '0' storage state

If C2nd−C1st≧0 '1' storage state

If the storage state of the selected memory cell during the first readout is determined to be '1', '1' is re-written in the selected cell to terminate the readout operation.

The readout time T2 of the second readout may be set so that the number of pulses read out when the memory cell read out by the second readout is in the '1' storage state will be intermediate between the number of pulses read out in the '0' storage state of the memory cell and that read out in the '1' storage state of the memory cell, in the readout with the first readout time T1. In this case, T1<T2. The '1' storage state is written after the first readout of the selected cell. The decision means 208 verifies the storage state of the selected cell at the time of the first readout, based on the above formulas for decision.

By setting the second readout time so as to be shorter or longer than the first readout time, as described above, the reference value register, required in the readout circuit 1 of the first embodiment, is not needed, while the decision means may be reduced in size.

Fourth Embodiment

Figure 14:
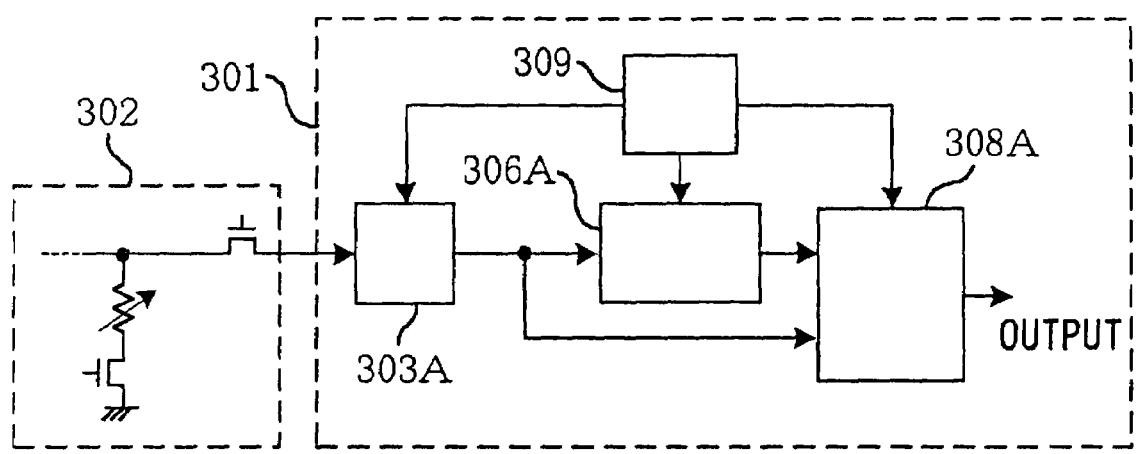
FIG. 14 is a circuit diagram of a readout circuit of a fourth embodiment of the present invention.

FIG. 14 depicts a circuit diagram of a readout circuit of a fourth embodiment of the present invention. Referring to FIG. 14, a readout circuit 301 of the present embodiment includes a gain-controllable preamplifier 303A, converting the current flowing through the selected cell into voltage, in an amplifying fashion, and which is capable of controlling the gain of conversion, a voltage storage means 306A for memorizing an output voltage of the gain-controllable preamplifier 303A, a voltage comparator 308A for comparing the output voltage of the voltage storage means 306A and that of the gain-controllable preamplifier 303A, and a control circuit 309 for controlling the readout circuit 301. In FIG. 14, the component parts having the functions which are the same as or similar to those shown in FIG. 7 are indicated by reference numerals having common lowermost digits and are not explained in detail.

To an input of the gain-controllable preamplifier 303A is connected a memory cell array 302 which is of the same structure as that of the memory cell arrays of the first to third embodiments described above.

In the present embodiment, the readout operation is performed by the self-referencing system by the first readout and the second readout. The voltage storage means 306A of FIG. 14 holds on memory the output voltage of the gain-controllable preamplifier 303A, output at the time of the first readout operation, until the second readout operation comes to a close. Moreover, the gain-controllable preamplifier 303A has the functions of changing the gain and/or the operating point at the time of the first readout operation and the second readout operation, as in the second embodiment.

Figure 15:
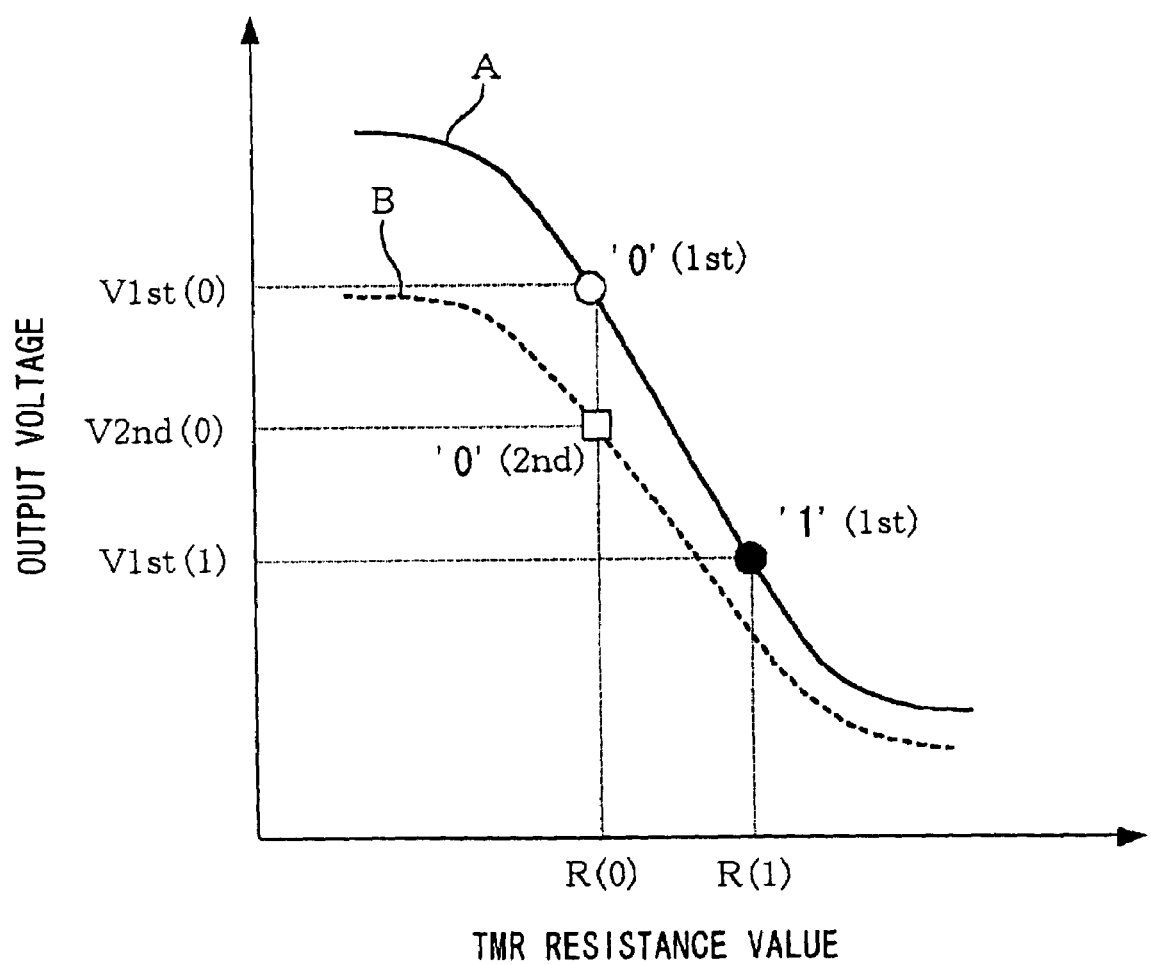
FIG. 15 is a graph for illustrating the operation of the gain control preamplifier of FIG. 14.

FIG. 15 shows how the output voltage of the gain-controllable preamplifier 303A is changed relative to the resistance value of the TMR of the memory cell. In FIG. 15, curves A and B stand for the TMR resistance value-output voltage characteristics of the gain-controllable preamplifier 303A, obtained for the gain values of the gain-controllable preamplifier 303A for the first readout and for the second readout, respectively. The gain of the gain-controllable preamplifier 303A for the first readout is set so as to be larger than that of the gain-controllable preamplifier 303A for the second readout. Meanwhile, the gain at the time of the first readout and that at the time of the second readout are adjusted so that the following relationship:

$V1st(1) < V2nd(0) < V1st(0)$ will be obtained among V1st(0), V1st(1) and V2nd(0), where V1st(0) and V1st(1) are the output voltages of the gain-controllable preamplifier 303A when the TMR is in the '0' storage state and in the '1' storage state, respectively, for the gain of the gain-controllable preamplifier 303A used for the first readout, and V2nd(0) is the output voltage of the gain-controllable preamplifier 303A when the TMR is in the '0' storage state for the gain of the gain-controllable preamplifier 303A used for the second readout.

Figure 16:
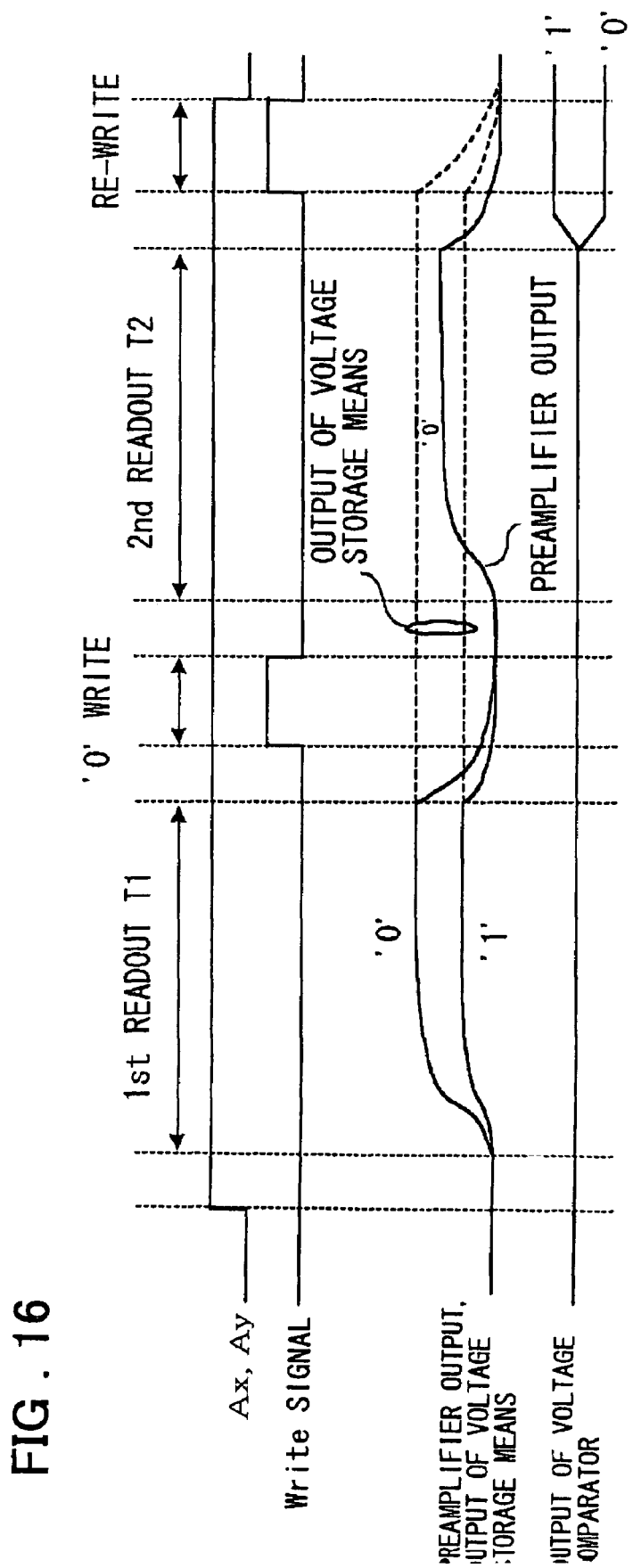
FIG. 16 illustrates the operation of a readout circuit of FIG. 14.

FIG. 16 illustrates the operation of the readout circuit 301 of FIG. 14. After the first readout from the selected cell, the selected cell is written to the '0' storage state, as in the first and second embodiments. The second readout is then carried out to perform the readout operation. The comparator 308A of FIG. 14 compares the output voltage of the voltage storage means 306A, holding on memory the gain-controllable preamplifier 303A during the first readout, to the output voltage of the gain-controllable preamplifier 303A during the second readout to verify the storage state of the selected cell at the time of the first readout. The gain values of the gain-controllable preamplifier 303A during the first readout and during the second readout are adjusted as described above, so that, if the output voltages of the gain-controllable preamplifier 303A during the first readout and during the second readout are labeled V1st and V2nd, respectively, the following discrimination formulas:

If $V2nd-V1st<0$ the '0' storage state if $V2nd-V1st \geq 0$ the '1' storage state explicitly hold.

Meanwhile, the '1' storage state, instead of the '0' storage state, may be written after the first readout, as in the second and third embodiments. In this case, the gain values of the gain-controllable preamplifier 303A during the first readout and during the second readout are adjusted for satisfying the condition: $V1st(1)<V2nd(1)<V1st(0)$. The storage state during the first readout of the selected cell is by the above-given discrimination formula.

Fifth Embodiment

Figure 17A:
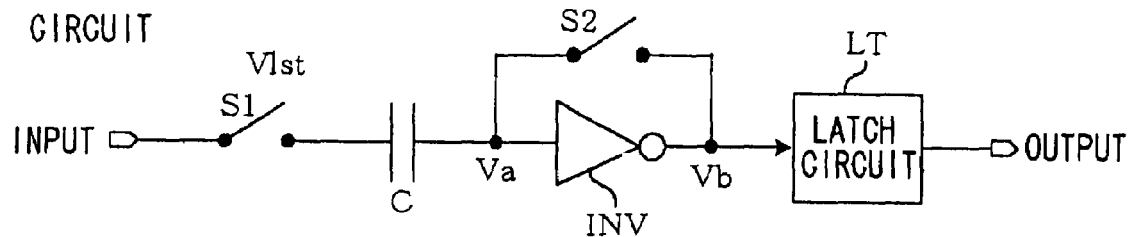
FIG. 17a is a circuit diagram of a part of the readout circuit of a fifth embodiment of the present invention and FIG. 17b illustrates the operation thereof.
Figure 17B:
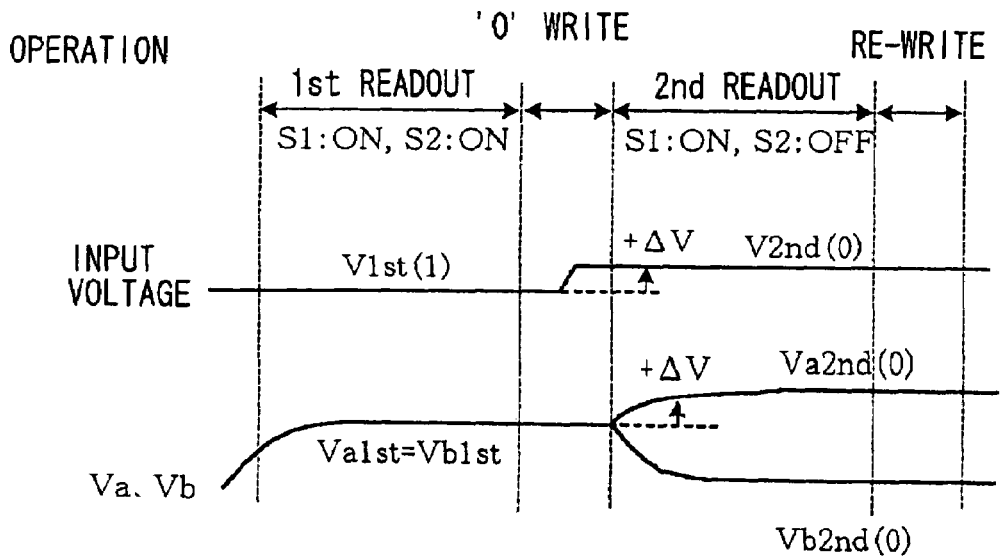

FIG. 17a is a circuit diagram showing essential parts of the readout circuit of the fifth embodiment of the present invention. The circuit shown in FIG. 17a performs the function of the storage means 306A and the voltage comparator 308A of the readout circuit of FIG. 14. Although not shown for the present embodiment, the gain-controllable preamplifier 303A and the control circuit 309, shown in FIG. 14, are provided in the readout circuit of the present embodiment. A switch S1, a capacitor C, an inverter INV and a latch circuit LT are connected in series, in this order, from an output end of the gain-controllable preamplifier towards an output end of the readout circuit. A switch S2 is connected in parallel with the inverter INV. An on/off operation of the switches S1 and S2 and the latch operations of the latch circuit LT are carried out by a control circuit, not shown. In FIG. 17b, illustrating the operation for FIG. 17a, it is presumed that the storage state of the selected cell at the time of the first readout is '1', and that, after the first readout, the selected cell is written to the '0' storage state. At the time of the first readout, the switches S1, S2 are both ON and the values of potentials Va and Vb on both ends of the inverter INV are equal to each other. The potential at the terminal of the capacitor C opposite to the inverter INV is equal to the output voltage V1st(1) of the gain-controllable preamplifier of the previous stage. Then, after writing the selected cell to the '0' storage state, the second readout operation is carried out. For the second readout, the switches S1 and S2 are turned on and off, respectively. At this time, the terminal voltage of the capacitor C towards the gain-controllable preamplifier rises to the output voltage V2nd(0) of the gain-controllable preamplifier. The input potential of the inverter INV then rises by [V2nd(0)−V1st(1)] and is swung towards the positive side, with the inverter output being "Low" and latched by the latch circuit. If, when the storage state of the selected cell during the first readout is '0', the selected cell is written to the '0' storage state, and the second readout is carried out, the input potential of the inverter INV is swung towards the negative side by [V2nd(0)−V1st(1)] with the inverter output being "High". This enables discrimination of the storage state of the selected cell during the first readout.

In the present and the fourth embodiments, there is no particular limitation to the readout time for the first readout and the second readout.

In the readout circuits of the fourth and fifth embodiments, the result of the first readout is stored as the voltage or the electrical charges in voltage storage means or in the capacitor. Consequently, a digital circuit for conversion to a digital value, such as a counter, a reference pulse generating means, a register or a decision means, may be deleted, and hence the circuit may appreciably be reduced in size, as compared to the conventional readout circuit. Moreover, since there is no necessity of counting the pulses, the readout speed may be increased [readout time may be reduced].

Sixth Embodiment

Figure 18:
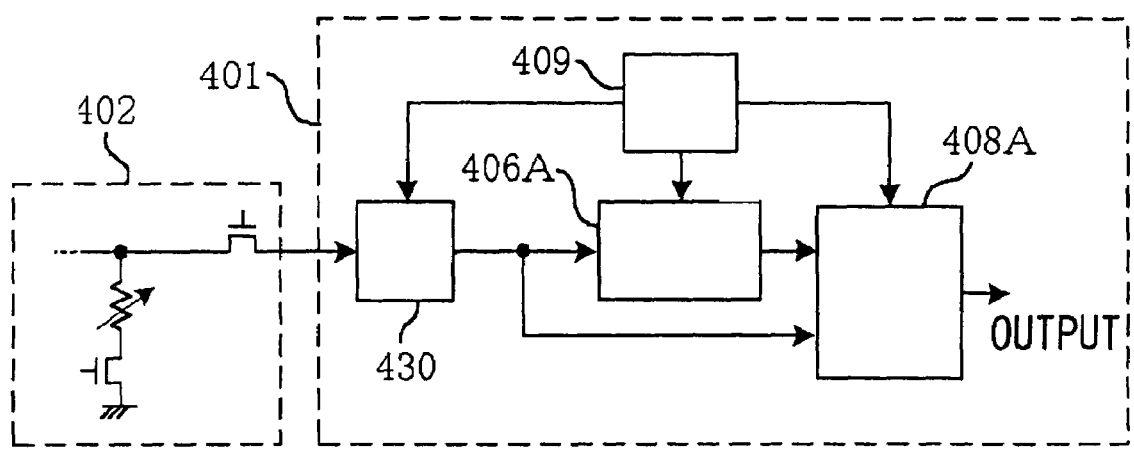
FIG. 18 is a circuit diagram of a readout circuit of a sixth embodiment of the present invention.

FIG. 18 depicts a circuit diagram of a readout circuit of a sixth embodiment of the present invention. Referring to FIG. 18, the readout circuit 401 of the present embodiment includes an integrating means 430 for time-integrating the current flowing through the selected cell, a voltage storage means 406A for holding on memory the output voltage of the integrating means 430, a voltage comparator 408A for comparing the output voltage of the voltage storage means 406A and the integrating means 430, and a control circuit 409 for controlling the readout circuit 401. In FIG. 18, the component parts having the functions which are the same as or similar to those shown in FIG. 14 are indicated by reference numerals having common lowermost digits and are not explained in detail.

To an input of the integrating means 430 is connected a memory cell array 402 which is of the same structure as that of the memory cell arrays of the first to fourth embodiments described above.

In the present embodiment, the readout operation is by the self-referencing system by the first readout and the second readout. The integrating time Tint1 for the first readout by the integrating means 430 and the integrating time Tint2 for the second readout are equal to each other. The voltage storage means 406A holds on memory the output voltage of the integrating means 430, output at the time of the first readout, until the end of the second readout operation.

Figure 19:
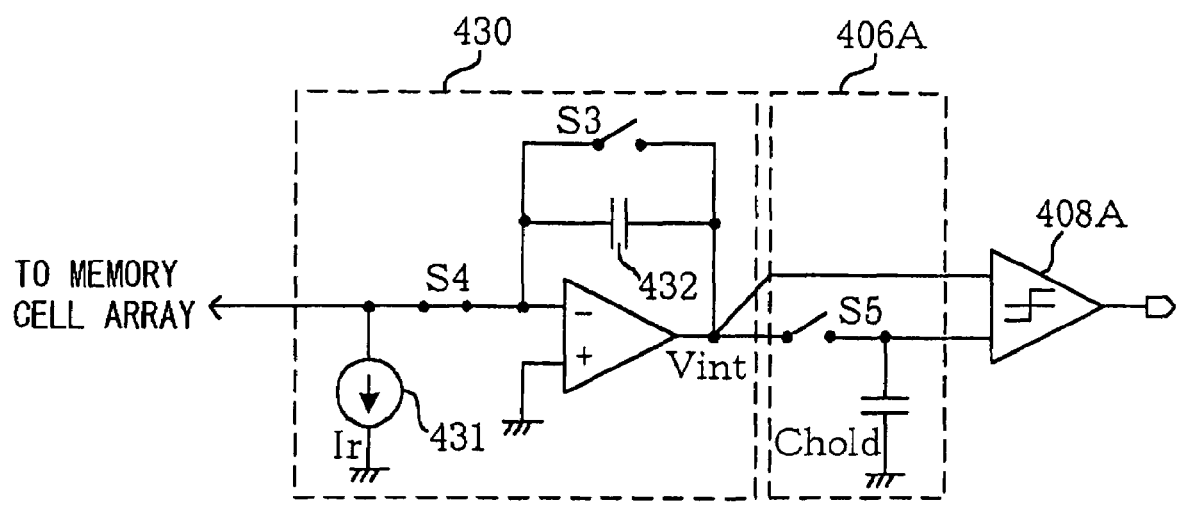
FIG. 19 is a circuit diagram of an integrating means, a voltage storage means and a voltage comparator of FIG. 18.

FIG. 19 is a circuit diagram of the integrating means 430, voltage storage means 406A and the voltage comparator 408A. To the integrating means 430 is connected a constant current source circuit 431, configured for branching the current flowing into the integrating means 430.

In the present embodiment, the time constant of the integrating means 430 for the first readout differs from that for the second readout. The time constant of the integrating means 430 may be changed by a variety of methods. First, the time constant of the integrating means 430 is changed by changing the capacitance value of an integrating capacitor 432. The time constant of the integrating means 430 may also be equivalently changed by changing the current Ir flowing through the constant current source circuit 431.

Taking an example of changing the current Ir flowing through the constant current source circuit 431 for the first readout and for the second readout, the method for carrying out the readout by changing the time constant of the integrating means 430 is now explained.

If the readout time is constant, the output Vint of the integrating means 430 becomes smaller, as the current Ir flowing through the constant current source circuit 431 is increased. The current Ir for the first readout and for the second readout is adjusted so that the following relationship:

$$\text{Vint1}st(1) < \text{Vint2}nd(0) < \text{Vint1}st(0) \qquad (2)$$

will be obtained, where Vint1*st*(0) and Vint1*st*(1) denote output voltages of the integrating means 430 when the TMR is in the '0' storage state and in the '1' storage state for the current Ir, during the first readout, respectively, and Vint2*nd* (0) denotes an output voltage of the integrating means 430 when the TMR is in the '0' storage state for the current Ir during the second readout.

Figure 20:
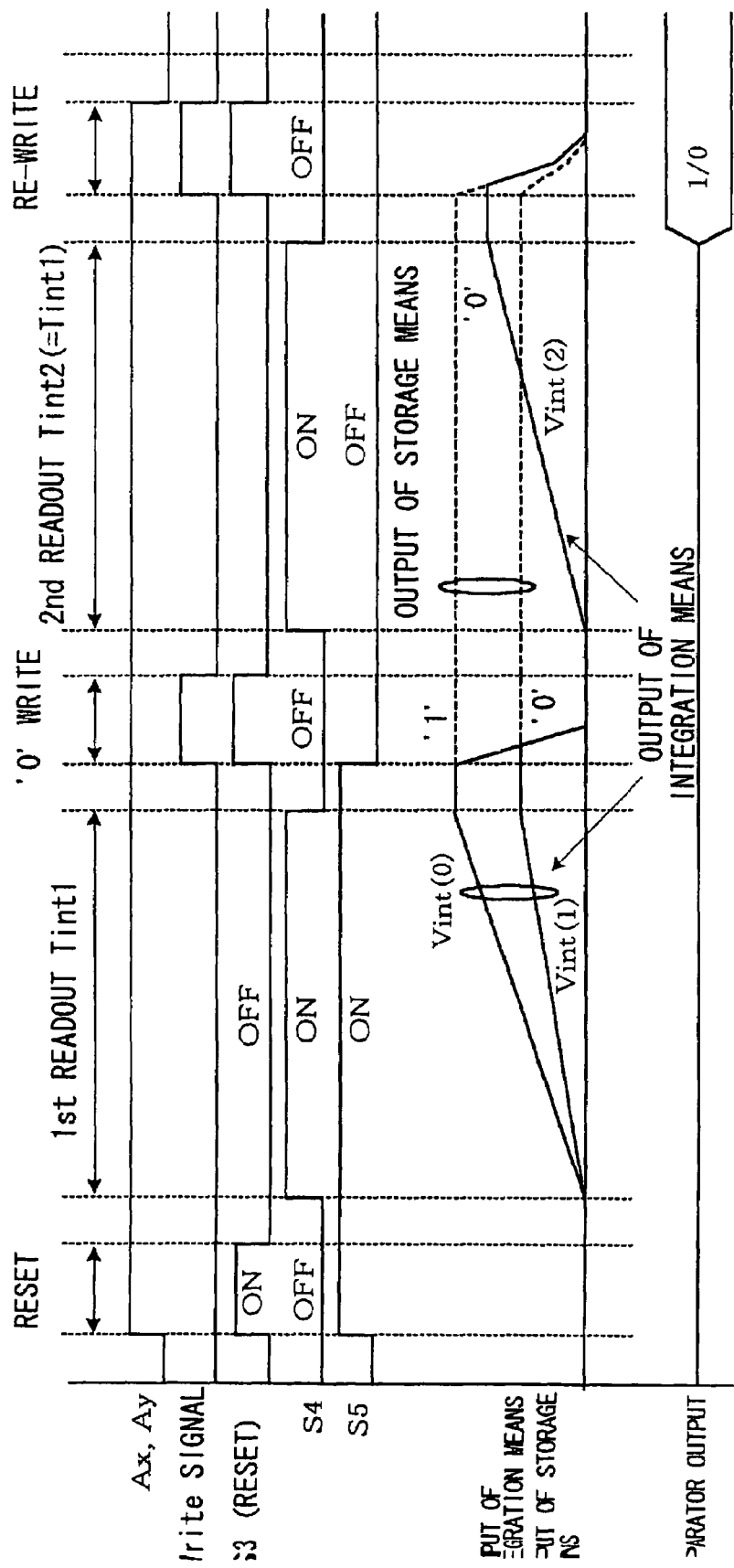
FIG. 20 illustrates the operation of a readout circuit 401 of FIG. 18.
Figures 21A, 21B:
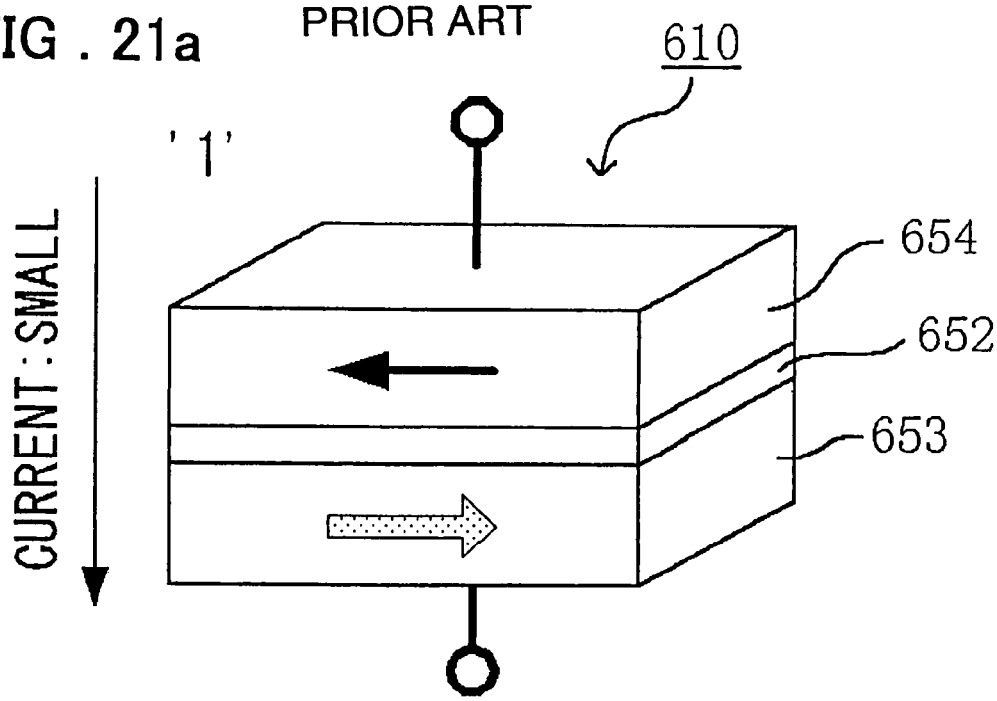
FIGS. 21a and 21b are perspective view for illustrating the structure and the principle of a tunnel magneto-resistive device.
Figure 22A:
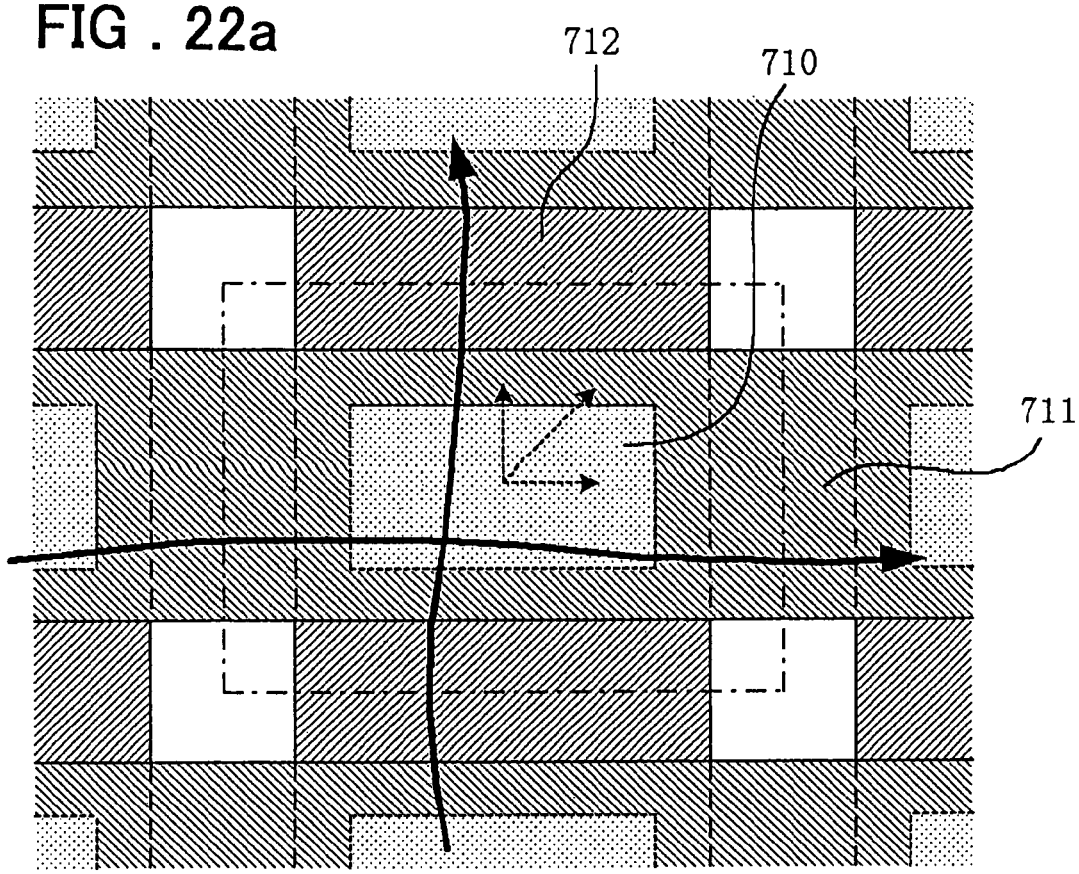
FIGS. 22a and 22b are a plan view and a cross-sectional view for illustrating the operation of the memory cell of the MRAM, respectively.
Figure 22B:
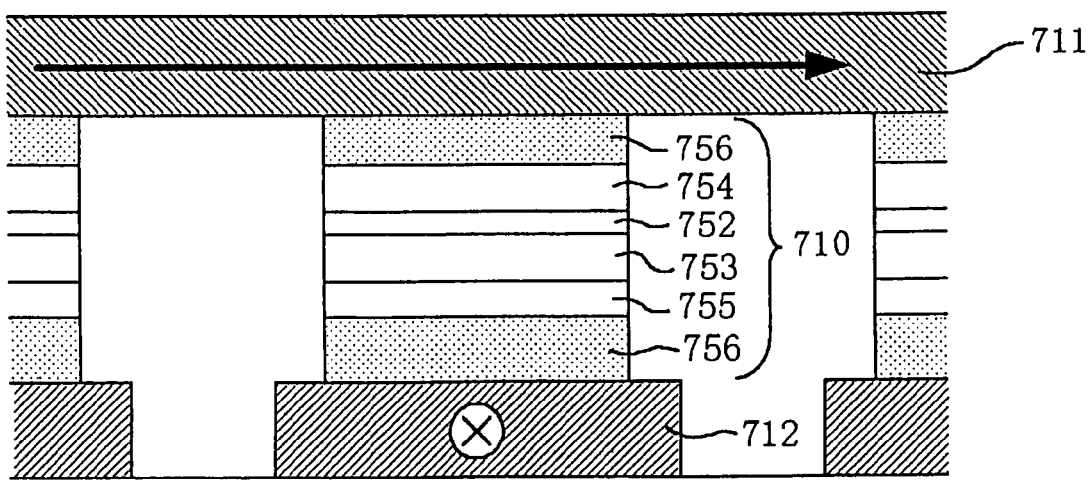

FIG. 20 illustrates the operation of the readout circuit 401 of FIG. 18. After executing the first readout from the selected cell, writing is carried out so that the '0' storage state is obtained. The second readout then is carried out to perform the readout operation. First, before entering into the first readout, the switch S3 of FIG. 19 is turned on to reset the integrating means 430. The switch S3 is turned off, while the switches S4 and S5 are turned on to start the first readout. When the time of Tint1 has elapsed, the switch S3 is turned on, while the switches S4 and S5 are turned off to reset the integrating means 430 again. At this time, an output voltage Vint1*st* of the integrating means 430 for the first readout is memorized (held on memory) in a capacitor Chold. Then, after the '0' storage state has been written in the selected cell, the switch S3 is turned off, while the switch S4 is turned on and the switch S5 is turned off to initiate the second readout again. After the lapse of the time Tint2 (=Tint1), the voltage comparator 408A compares the output voltage Vint2*nd* of the integrating means 430 to the voltage Vint1*st*, held on memory by the capacitor Chold to verify the storage state during the first readout of the selected cell. Since the current Ir during the first readout and during the second readout is adjusted as described above, the following formulas for discrimination:

If *Vint*2nd−Vint1st<0 '0' storage state

If *Vint*2nd−Vint1st≧0 '1' storage state is evidently derived.

Meanwhile, the '1' storage state, instead of the '0' storage state, may also be written after the first readout, as in the second to fourth embodiments, described above. In such case, the current Ir during the first readout and during the second readout of the constant current source circuit 431 is selected so that the condition of Vint1*st*(1)<Vint2*nd*(1) <Vint1*st*(0) will be met. The storage state during the first readout of the selected cell is selected based on the formulas for discrimination given above.

Finally, the readout data output from the voltage comparator 408A is re-written in the selected cell, as necessary, to terminate a sequence of the readout operations.

In the above explanation, the time constant of the integrating means 430 is equivalently changed by varying the current Ir of the constant current source circuit 431. Alternatively, the time constant of the integrating means 430 may also be changed by varying the capacitance value of the integrating capacitor 432 so that the inequality (2) will hold.

It is also possible to set the time constant of the integrating means 430 so as to be constant for the first readout and for the second readout and to set the integrating time Tint1 for the first readout and the integrating time Tint2 for the second readout to different values satisfying the inequality (2).

The integrating means 430 also has the effect of eliminating the offset component or the noise component of the current supplied from the memory cell array 402 to the readout circuit.

In the readout circuit 401 of the present embodiment, described above, the result of the first readout is stored in the capacitor as electrical charges. Consequently, a digital circuit such as a counter for conversion to a digital value, a reference pulse generating means, a register and a decision means, may be deleted, and hence the circuit may appreciably be reduced in size, as compared to the conventional readout circuit.

Although the present invention has been described based on preferred embodiments thereof, the readout device of the present invention is not limited to these embodiments, such that readout devices modified without changing the purport of the invention may also be comprised within the scope of the invention. For example, the states of the directions of magnetization of the pin layer and the free layer being anti-parallel or parallel may be used as the '0' storage state and the '1' storage state, respectively. The memory cell array is not limited to a two-dimensional array, but may also be a one-dimensional array. The memory cell also is not limited to the TMR. For example, the memory cell, the resistance value of which is changed by an electrical or optical output, such as a memory cell, the resistance value of which is changed by electro-migration, as disclosed in JP Patent JP-A-2001-267513, may also be used.

INDUSTRIAL APPLICABILITY

In the above-described readout circuit, according to the present invention, in which the VCO is used as integrating means for integrating the current from the selected memory cell, digital conversion may be effected readily, while a low voltage operation may be enabled, as the wraparound current from the memory cell array or the a.c.-related noise current is eliminated, and reference pulse generating means or the integrating capacitor may be eliminated, thus enabling the circuit area or the power consumption to be decreased.

Moreover, the readout circuit according to the present invention memorizes the current from the selected memory cell as electrical charges or voltage, so that there is no necessity of converting the current from the selected memory cell into digital values. Consequently, the digital circuit, such a counter, register or decision means, as well as the reference pulse generating means, may be eliminated, with the result that the circuit scale and the power consumption may be reduced, while the shorter readout time may be achieved.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A readout circuit for a semiconductor storage device, a memory cell array of which is formed by a plurality of memory cells, each having two storage states, namely a first storage state with a relatively low resistance value and a second storage state with a relatively high resistance value, said readout circuit comprising:

a preamplifier for detecting a current entered from a selected one of said memory cells for converting the detected current into a voltage;

voltage storage means for holding an output voltage of said preamplifier in memory; and voltage comparator means for comparing the output voltage of said preamplifier to an output voltage of said voltage storage means.

2. The readout circuit for the semiconductor storage device as defined in claim 1, wherein, after selection of said selected cell, first readout, writing said first storage state or said second storage state in said selected cell following said first readout, and second readout, following said writing, are carried out, and wherein the storage state of said selected cell is verified by said voltage comparator means.

3. The readout circuit for the semiconductor storage device as defined in claim 2, wherein said preamplifier operates with a gain and/or an operating point different for the first readout from a gain and/or an operating point for the second readout.

4. The readout circuit for the semiconductor storage device as defined in claim 3, wherein the gain and/or the operating point for said preamplifier for the first readout and for the second readout is adjusted so that, in case where readout is made using an optional one of the memory cells in said memory cell array;

the first storage state and the second storage state are written in said selected cell during said writing, the following relationship:

$V1st(2) < V2nd(1) < V1st(1)$ $V1st(2) < V2nd(2) < V1st(1)$ will hold;

assuming that an output voltage of said preamplifier in case said memory cell is in a first storage state and in a second storage state, in the gain and/or the operating point of said preamplifier during said first readout, is V1st(1) and V1st(2), respectively, and if, when readout is made using an optional one of the memory cells in said memory cell array, and assuming that an output voltage of said preamplifier in case said memory cell is in a first storage state and in a second storage state, in the gain and/or the operating point of said preamplifier during said second readout, is V2nd(1) and V2nd(2), respectively.

5. The readout circuit for the semiconductor storage device as defined in claim 2, wherein, if the output voltage of said preamplifier for first readout and that for second readout are V1st and V2nd, respectively, said voltage comparator means verifies the storage state for the first readout of said selected cell based on the following inequalities:

if $V2nd - V1st < 0$ the first storage state and if $V2nd - V1st \geq 0$ the second storage state.

6. The readout circuit for the semiconductor storage device as defined in claim 2, wherein, if the verified storage state for said first readout of the selected cell differs from the storage state written by said writing, the storage state in said selected cell for said first readout is written in said selected cell after the verification of said storage state.

7. The readout circuit for the semiconductor storage device as defined in claim 1, wherein said memory cell has a tunnel magneto-resistance element.

8. A readout circuit for a semiconductor storage device, a memory cell array of which is formed by a plurality of memory cells each having two storage states, namely a first storage state with a relatively low resistance value and a second storage state with a relatively high resistance value, said readout circuit comprising:
  a preamplifier for detecting a current entered from a selected one of said memory cells for converting the so detected current into a voltage;
  first switch means having a first and second lead, said first switch means for turning an output of said preamplifier on or off;
  a capacitor having one end connected to said second lead of said first switch means;
  an inverter connected to said other end of said capacitor;
  a latch circuit connected to an output of said inverter; and
  second switch means connected in parallel with said inverter.

9. The readout circuit for the semiconductor storage device as defined in claim 8, wherein, after selection of said selected cell, first readout, writing said first storage state or said second storage state in said selected cell following said first readout, and second readout, following said writing, are carried out, and wherein the storage state of said selected cell is verified by said latch circuit.

10. The readout circuit for the semiconductor storage device as defined in claim 9, wherein said preamplifier operates with a gain and/or an operating point different for the first readout from a gain and/or an operating point for the second readout.

11. The readout circuit for the semiconductor storage device as defined in claim 10, wherein
  the gain and/or the operating point for said preamplifier for the first readout and for the second readout is adjusted so that, in case where readout is made using an optional one of the memory cells in said memory cell array;
  the first storage state and the second storage state are written in said selected cell during said writing, the following relationship:

$V1st(2) < V2nd(1) < V1st(1)$ $V1st(2) < V2nd(2) < V1st(1)$ will hold;
  assuming that an output voltage of said preamplifier in case said memory cell is in a first storage state and in a second storage state, in the gain and/or the operating point of said preamplifier during said first readout, is V1st(1) and V1st(2), respectively, and if, when readout is made using an optional one of the memory cells in said memory cell array, and
  assuming that an output voltage of said preamplifier in case said memory cell is in a first storage state and in a second storage state, in the gain and/or the operating point of said preamplifier during said second readout, is V2nd(1) and V2nd(2), respectively.

12. The readout circuit for the semiconductor storage device as defined in claim 9, wherein said first and second switch means are closed for said first readout, said first switch means is closed and said second switch means is opened for said second readout and wherein an output voltage of said inverter for said second readout is latched by said latch circuit.

13. The readout circuit for the semiconductor storage device as defined in claim 9, wherein, if the verified storage state for said first readout of the selected cell differs from the storage state written by said writing, the storage state in said selected cell for said first readout is written in said selected cell after the verification of said storage state.

14. The readout circuit for the semiconductor storage device as defined in claim 8, wherein said memory cell has a tunnel magneto-resistance element.

15. A readout circuit for a semiconductor storage device, a memory cell array of which is formed by a plurality of memory cells each having two storage states, namely a first storage state with a relatively low resistance value and a second storage state with a relatively high resistance value, said readout circuit comprising:
  integrating means for integrating a current entered from a selected one of said memory cells;
  voltage storage means for holding on memory an output voltage from said integrating means; and
  a voltage comparator for comparing the output voltage of said integrating means to an output voltage of said voltage storage means.

16. The readout circuit for the semiconductor storage device as defined in claim 15, wherein, after selection of said selected cell, first readout, writing said first storage state or said second storage state in said selected cell following said first readout, and second readout, following said writing, are carried out, and wherein the storage state of said selected cell is verified by said voltage comparator.

17. The readout circuit for the semiconductor storage device as defined in claim 16, wherein said integrating means has a time constant for said first readout different from the time constant for the second readout.

18. The readout circuit for the semiconductor storage device as defined in claim 17, wherein
  the time constant of said integrating means for the first readout and for the second readout is adjusted so that, in case where readout is made using an optional one of the memory cells in said memory cell array;
  the first storage state and the second storage state are written in said selected cell during said writing, the following relationship:

$V1st(2) < V2nd(1) < V1st(1)$ $V1st(2) < V2nd(2) < V1st(1)$ will hold;
  assuming that an output voltage of said integrating means in case said memory cell is in a first storage state and in a second storage state, in the time constant of said integrating means during said first readout, is V1st(1) and V1st(2), respectively, and if, when readout is made using an optional one of the memory cells in said memory cell array, and
  assuming that an output voltage of said integrating means in case said memory cell is in a first storage state and in a second storage state, in the time constant of said integrating means during said second readout, is V2nd(1) and V2nd(2), respectively.

19. The readout circuit for the semiconductor storage device as defined in claim 16, wherein the integrating time for said first readout differs from the integrating time for said second readout.

20. The readout circuit for the semiconductor storage device as defined in claim 19, wherein
  the integrating time of said integrating means for the first readout and for the second readout is adjusted so that, in case where readout is made using an optional one of the memory cells in said memory cell array;

the first storage state and the second storage state are written in said selected cell during said writing, the following relationship:

$$V1st(2)<V2nd(1)<V1st(1)$$

$$V1st(2)<V2nd(2)<V1st(1)$$

will hold;

assuming that an output voltage of said integrating means in case said memory cell is in a first storage state and in a second storage state, in the integrating time of said integrating means during said first readout, is V1st(1) and V1st(2), respectively, and if, when readout is made using an optional one of the memory cells in said memory cell array, and assuming that an output voltage of said integrating means in case said memory cell is in a first storage state and in a second storage state, in the integrating time of said integrating means during said second readout, is V2nd(1) and V2nd(2), respectively.

21. The readout circuit for the semiconductor storage device as defined in claim 16, wherein, if the output voltage of said integrating means for first readout and that for second readout are V1st and V2nd, respectively, said voltage comparator means verifies the storage state for the first readout of said selected cell based on the following inequalities:

if $V2nd-V1st<0$ the first storage state and if $V2nd-V1st\geq 0$ the second storage state.

22. The readout circuit for the semiconductor storage device as defined in claim 16, wherein, if the verified storage state for said first readout of the selected cell differs from the storage state written by said writing, the storage state in said selected cell for said first readout is written in said selected cell after the verification of said storage state.

23. The readout circuit for the semiconductor storage device as defined in claim 15, wherein said memory cell has a tunnel magneto-resistance element.

* * * * *